(12) United States Patent
Snis

(10) Patent No.: US 11,925,983 B2
(45) Date of Patent: Mar. 12, 2024

(54) DEVICES, SYSTEMS, AND METHODS FOR USING AN IMAGING DEVICE TO CALIBRATE AND OPERATE A PLURALITY OF ELECTRON BEAM GUNS IN AN ADDITIVE MANUFACTURING SYSTEM

(71) Applicant: ARCAM AB, Mölnlycke (SE)

(72) Inventor: Anders Snis, Uddevalla (SE)

(73) Assignee: Arcam AB, Mölnlycke (SE)

( * ) Notice: Subject to any disclaimer, the term of this patent is extended or adjusted under 35 U.S.C. 154(b) by 266 days.

(21) Appl. No.: 17/350,026

(22) Filed: Jun. 17, 2021

(65) Prior Publication Data

US 2022/0402036 A1  Dec. 22, 2022

(51) Int. Cl.
| | | |
|---|---|---|
| *B22F 10/31* | (2021.01) | |
| *B22F 10/85* | (2021.01) | |
| *B22F 12/33* | (2021.01) | |
| *B22F 12/41* | (2021.01) | |
| *B22F 12/45* | (2021.01) | |
| *B22F 12/52* | (2021.01) | |
| *B22F 12/90* | (2021.01) | |
| *B33Y 10/00* | (2015.01) | |

(Continued)

(52) U.S. Cl.
CPC ............. *B22F 10/31* (2021.01); *B22F 10/85* (2021.01); *B22F 12/33* (2021.01); *B22F 12/41* (2021.01); *B22F 12/45* (2021.01); *B22F 12/52* (2021.01); *B22F 12/90* (2021.01); *B33Y 10/00* (2014.12); *B33Y 30/00* (2014.12); *B33Y 50/02* (2014.12); *H01J 37/222* (2013.01); *H01J 37/304* (2013.01); *B22F 10/28* (2021.01); *H01J 2237/30433* (2013.01)

(58) Field of Classification Search
CPC ....... H01J 37/222; H01J 37/304; B33Y 10/00; B33Y 30/00; B33Y 50/02; B22F 12/45; B22F 12/52; B22F 12/90; B22F 12/33; B22F 12/41; B22F 10/28; B22F 10/73; B22F 10/31; B22F 10/85
See application file for complete search history.

(56) References Cited

U.S. PATENT DOCUMENTS

| | | |
|---|---|---|
| 4,442,361 A | 4/1984 | Zasio et al. |
| 4,988,844 A | 1/1991 | Dietrich et al. |

(Continued)

OTHER PUBLICATIONS

Extended European Search Report for Application No. 22173821.4 dated Sep. 29, 2022 (8 pages).

*Primary Examiner* — Moshe Wilensky
(74) *Attorney, Agent, or Firm* — Dinsmore & Shohl LLP

(57) ABSTRACT

Calibration systems, additive manufacturing systems employing the same, and methods of calibrating include a plurality of electron beam guns. One calibration system includes an imaging device positioned to capture one or more images of an impingement of electron beams emitted from the plurality of electron beam guns on a surface within a build chamber of the electron beam additive manufacturing system and an analysis component communicatively coupled to the imaging device. The analysis component is programmed to receive image data corresponding to the one or more images, determine one or more calibration parameters from the image data, and transmit one or more instructions to the plurality of electron beam guns in accordance with the one or more calibration parameters.

18 Claims, 11 Drawing Sheets

(51) Int. Cl.
    *B33Y 30/00*     (2015.01)
    *B33Y 50/02*     (2015.01)
    *H01J 37/22*     (2006.01)
    *H01J 37/304*     (2006.01)
    *B22F 10/28*     (2021.01)

(56) References Cited

U.S. PATENT DOCUMENTS

| | | |
|---|---|---|
| 5,155,359 A | 10/1992 | Monahan |
| 5,424,548 A | 6/1995 | Puisto |
| 5,798,528 A | 8/1998 | Butsch et al. |
| 7,075,093 B2 | 7/2006 | Gorski et al. |
| 8,198,797 B2 | 6/2012 | Iijima et al. |
| 2015/0004045 A1 | 1/2015 | Ljungblad |
| 2017/0087661 A1 | 3/2017 | Backlund et al. |
| 2019/0302043 A1 | 10/2019 | Lobastov et al. |
| 2021/0001559 A1 | 1/2021 | Thiel |
| 2022/0143744 A1* | 5/2022 | Hellgren ............... B29C 64/268 |

* cited by examiner

DEVICES, SYSTEMS, AND METHODS FOR USING AN IMAGING DEVICE TO CALIBRATE AND OPERATE A PLURALITY OF ELECTRON BEAM GUNS IN AN ADDITIVE MANUFACTURING SYSTEM

FIELD

The present disclosure relates to devices, systems, and methods for employing a plurality of electron beam guns in an additive manufacturing system, and more specifically, for calibrating the plurality of electron beam guns and/or coordinating movement and/or precision of each of the plurality of electron beam guns.

BACKGROUND

In additive manufacturing processes, particularly those that utilize a plurality of electron beam guns to melt a powder layer to create an article, it may be necessary to ensure that the electron beam guns operate in a manner that avoids and/or minimizes interaction. Shielding of the electron beam guns and/or components thereof may not always be feasible or desirable.

SUMMARY

In a first aspect, a calibration system for an electron beam additive manufacturing system having a plurality of electron beam guns includes an imaging device positioned to capture one or more images of an impingement of electron beams emitted from the plurality of electron beam guns on a surface within a build chamber of the electron beam additive manufacturing system. The calibration system further includes an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters.

In a second aspect, an electron beam additive manufacturing system includes a build chamber, a plurality of electron beam guns, each one of the plurality of electron beam guns emitting a corresponding electron beam within the build chamber, and a calibration system that calibrates each one of the plurality of electron beam guns. The calibration system includes an imaging device positioned to capture one or more images of an impingement of electron beams emitted from the plurality of electron beam guns on a surface within the build chamber and an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters.

In a third aspect, a method of calibrating a plurality of electron beam guns in a build chamber includes directing a first electron beam gun of the plurality of electron beam guns to execute a first scan function. The first scan function causing a first electron beam emitted from the first electron beam gun to impinge on a plurality of portions of a first portion of a surface in the build chamber. The method further includes providing one or more predetermined coil values to a second electron beam gun of the plurality of electron beam guns. The predetermined coil values, when executed, cause the second electron beam gun to emit a second electron beam that impinges along a predetermined path on a second portion of the surface. The method further includes receiving image data from an imaging device having a field of view that encompasses the surface. The image data is indicative of features of the first electron beam upon impingement on the surface. The method further includes synchronizing in time the image data with coil values of the first electron beam gun and the predetermined coil values of the second electron beam gun.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

The present disclosure generally relates to devices, systems, and methods that allow for use of a plurality of electron beam guns to form metallic articles. The plurality of electron beam guns should be particularly arranged and configured to avoid an issue where interaction occurs between the coils that alter the electron beams respectively emitted therefrom, particularly when shielding is impractical, unavailable, not possible, not feasible, and/or not desirable. This interaction can be avoided or minimized by calibrating the electron beam guns with respect to one another, by coordinating the movement of the electron beam guns, and/or controlling a sequence of movement and/or precision (e.g., low precision mode, high precision mode) of each of the electron beam guns relative to other electron beam guns, as described in greater detail herein.

Shielding, which generally includes placing a shroud of material around one or more components of an electron beam gun (e.g., around one or more coils of an electron beam gun), can sometimes be effective in preventing magnetic interference in instances where a plurality of electron beam guns is used adjacent to one another. However, shielding is not always completely effective and interaction may still occur. Further, shielding may undesirably cause induction in some systems, which may slow down movement of electron beams emitted by the electron beam guns.

Figure 1A:
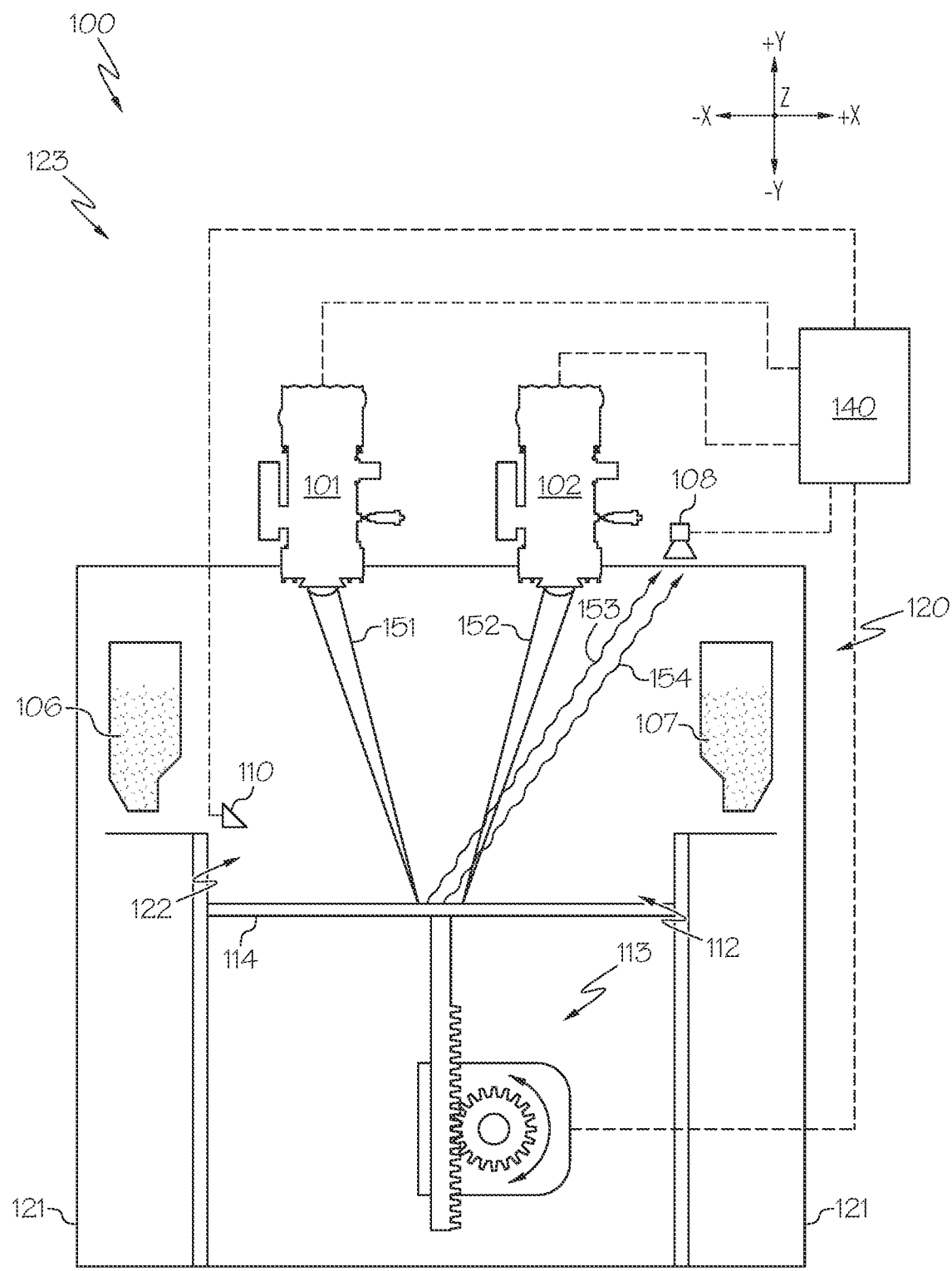
FIG. 1A schematically depicts a cutaway side view of an illustrative additive manufacturing system including a plurality of electron beam emitters and an imaging device according to one or more embodiments shown and described herein.

One such particularly configured additive manufacturing system that includes a plurality of electron beam emitters and an imaging device is depicted in FIG. 1A, whereby each one of the plurality of electron beam emitters is calibrated, a movement sequence is coordinated, and/or a sequence of precision is coordinated. As such, the devices, systems, and methods described herein can result in quicker and more accurate formation of an article using electron beam melting without issues that were traditionally caused by the use of a plurality of electron beam emitters (e.g., interaction, use of shielding, and/or the like).

Electron-beam additive manufacturing, which may also be known as electron-beam melting (EBM), is a type of additive manufacturing (e.g., 3D printing) process that is typically used for metallic articles. EBM utilizes a raw material in the form of a metal powder or a metal wire, which is placed under a vacuum (e.g., within a vacuum sealed build chamber). Generally speaking, the raw material is fused together from heating via an electron beam.

The systems described herein that utilize EBM generally obtain data from a 3D computer-aided design (CAD) model and use the data to place successive layers of the raw material using an apparatus to spread the raw material, such as a powder distributor. The successive layers are melted together utilizing a plurality of electronically-controlled electron beams. As noted above, the process takes place under vacuum within a vacuum sealed build chamber, which makes the process suited to manufacture parts using reactive materials having a high affinity for oxygen (e.g., titanium). In embodiments, the process operates at higher temperatures (up to about 1000° C.) relative to other additive manufacturing processes, which can lead to differences in phase formation through solidification and solid-state phase transformation.

Figure 1B:
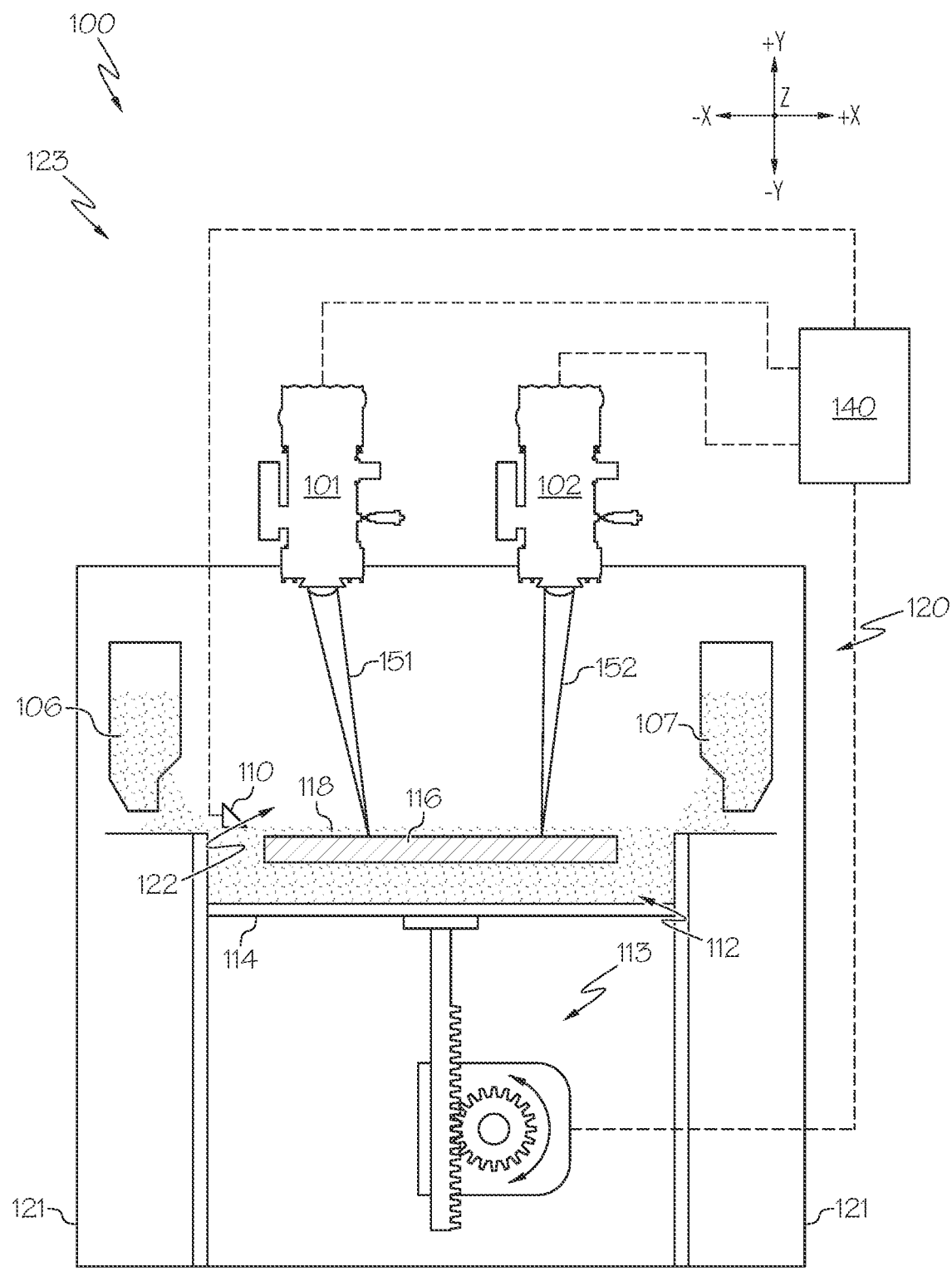
FIG. 1B schematically depicts a cutaway side view of the illustrative additive manufacturing system of FIG. 1A after a calibration process according to one or more embodiments shown and described herein.

FIGS. 1A and 1B depict embodiments of the present disclosure with an imaging device 108 installed as shown in FIG. 1A for the purposes of calibration and removed as shown in FIG. 1B for the purposes of EBM after calibration. As shown in FIGS. 1A-1B, an additive manufacturing system 100 includes at least a build chamber 120, a plurality of electron beam (EB) guns (e.g., a first EB gun 101 and a second EB gun 102), and an analysis component 140. As shown in FIG. 1A, the build chamber 120 also includes an imaging device 108. The imaging device 108 may be removed from the additive manufacturing system 100 during EBM once calibration has been completed, as depicted in FIG. 1B. However, this is not a requirement, as the imaging device 108 may remain during EBM processes after calibration has occurred in other embodiments.

Referring to both FIGS. 1A and 1B, the build chamber 120 defines an interior 122 that is separated from an exterior environment 123 via one or more chamber walls 121. In some embodiments, due to the harsh environment within the build chamber 120, the imaging device 108 is generally located adjacent to the build chamber 120 in the exterior environment 123 (i.e., not located within the interior 122 of the build chamber 120), and is arranged to detect various properties of electron beams within the interior 122 of the build chamber 120, as well as movement and/or locations of the beams relative to one another and/or various components of the build chamber 120. However, it should be understood that the location of the imaging device 108 outside the build chamber 120 is not limited by this disclosure. That is, in other embodiments, the imaging device 108 may be located in the interior 122 of the build chamber 120. Further, the imaging device 108 may be fixed in a particular location or may be movable (e.g., movable to capture images at different angles or the like within the build chamber 120. In some embodiments, the imaging device 108 may be removable from the build chamber, as depicted in FIG. 1B for example. While FIG. 1A only depicts a single imaging device 108, the present disclosure is not limited to such. That is, the additive manufacturing system 100 may include a plurality of imaging devices 108.

In some embodiments, the interior 122 of the build chamber 120 may be a vacuum sealed interior such that an article 116 (FIG. 1B) formed within the build chamber 120 is formed under optimal conditions for EBM, as is generally understood. Still referring to FIGS. 1A-1B, the build chamber 120 is capable of maintaining a vacuum environment via a vacuum system. Illustrative vacuum systems may include, but are not limited to, a turbo molecular pump, a scroll pump, an ion pump, and one or more valves, as are generally understood. In some embodiments, the vacuum system may be communicatively coupled to the analysis component 140 such that the analysis component 140 directs operation of the vacuum system to maintain the vacuum within the interior 122 of the build chamber 120. In some embodiments, the vacuum system may maintain a base pressure of about $1 \times 10^{-5}$ mbar or less throughout an entire build cycle.

In further embodiments, the vacuum system may provide a partial pressure of He to about 2×10⁻³ mbar during a melting process.

In other embodiments, the build chamber 120 may be provided in an enclosable chamber provided with ambient air and atmosphere pressure. In yet other embodiments, the build chamber 120 may be provided in open air.

The build chamber 120 generally includes within the interior 122 a build envelope 112 including a build platform 114 supporting a powder layer 118 (FIG. 1B) thereon after calibration, as well as a powder distributor 110. Still referring to FIGS. 1A-1B, in some embodiments, the build chamber 120 may further include one or more raw material hoppers 106, 107 that maintain raw material therein. The build chamber 120 may further include other components, particularly components that facilitate EBM, including components not specifically described herein.

The build envelope 112 is generally an area within the interior 122 of the build chamber 120 that includes a platform or receptacle that is arranged to receive the raw material from the one or more raw material hoppers 106, 107 and/or support a workpiece thereon. The build envelope 112 is not limited in size or configuration by the present disclosure, but may generally be shaped and sized to hold an amount of the raw material from the raw material hoppers 106, 107 in the form of the powder layer 118, one or more portions of article 116, and/or unfused raw material (FIG. 1B), as described in greater detail herein.

Still referring to FIGS. 1A-1B, in some embodiments, the build envelope 112 may include a movable build platform 114 supported by a lifting component 113. The movable build platform 114 may generally be a surface within the build envelope 112 that is movable by the lifting component 113 in a system vertical direction (e.g., in the +y/−y directions of the coordinate axes of FIGS. 1A-1B) to increase and/or decrease a total volume of the build envelope 112. For example, the movable build platform 114 within the build envelope 112 may be movable by the lifting component 113 in a downward direction (e.g., toward the −y direction of the coordinate axes of FIGS. 1A-1B) so as to increase the volume of the build envelope 112. Referring specifically to FIG. 1B, the movable build platform 114 may be movable (e.g., capable of being lowered) by the lifting component 113 to add each successive powder layer 118 to the article 116 being formed, as described in greater detail herein.

Referring again to FIGS. 1A-1B, the lifting component 113 is not limited by the present disclosure, and may generally be any device or system capable of being coupled to the movable build platform 114 and movable to raise or lower the movable build platform 114 in the system vertical direction (e.g., in the +y/−y directions of the coordinate axes of FIGS. 1A-1B). In some embodiments, the lifting component 113 may utilize a linear actuator type mechanism to effect movement of the movable build platform 114. Illustrative examples of devices or systems suitable for use as the lifting component 113 include, but are not limited to, a scissor lift, a mechanical linear actuator such as a screw based actuator, a wheel and axle actuator (e.g., a rack and pinion type actuator), a hydraulic actuator, a pneumatic actuator, a piezoelectric actuator, an electromechanical actuator, and/or the like. In some embodiments, the lifting component 113 may be located within the build chamber 120. In other embodiments, the lifting component 113 may be only partially located within the build chamber 120, particularly in embodiments where it may be desirable to isolate portions of the lifting component 113 that are sensitive to the harsh conditions (e.g., high heat, excessive dust, etc.) within the interior 122 of the build chamber 120.

Referring to FIG. 1B, the powder distributor 110 is generally arranged and configured to lay down and/or spread a layer of the raw material as the powder layer 118 in the build envelope 112 (e.g., on start plate or the build platform 114 within the build envelope 112). That is, the powder distributor 110 is arranged such that movement of the powder distributor 110 is in a horizontal plane defined by the x-axis and the z-axis of the coordinate axes depicted in FIG. 1B. For example, the powder distributor 110 may be an arm, rod, or the like that extends a distance in the +y/−y direction over or above the build envelope 112 (e.g., from a first end to a second end of the build envelope 112). In some embodiments, the length of the powder distributor 110 may be longer than a width of the build platform 114 such that the powder layer 118 can be distributed on each position of the build platform 114. In some embodiments, the powder distributor 110 may have a central axis in parallel with a top surface of the build platform 114 (e.g., generally parallel to the +x/−x axis of the coordinate axes of FIG. 1B). One or more motors, actuators, and/or the like may be coupled to the powder distributor 110 to effect movement of the powder distributor 110. For example, a rack and pinion actuator may be coupled to the powder distributor 110 to cause the powder distributor 110 to move back and forth over the build envelope in the +x/−x directions of the coordinate axes of FIG. 1B. In some embodiments, movement of the powder distributor 110 may be continuous (e.g., moving without stopping, other than to change direction). In other embodiments, movement of the powder distributor 110 may be stepwise (e.g., moving in a series of intervals, while stopping in between intervals for a period of time). In yet other embodiments, movement of the powder distributor 110 may be such that a plurality of interruptions occur between periods of movement.

The powder distributor 110 may further include one or more teeth (e.g., rake fingers or the like) that extend from the powder distributor 110 into the raw material from the raw material hoppers 106, 107 to cause disruption of the raw material when the powder distributor 110 moves (e.g., to distribute the raw material, to spread the powder layer 118, etc.). For example, the powder distributor 110 may include a plurality of rake teeth extending from a bottom surface of the powder distributor 110 (e.g., extending generally towards the −z direction of the coordinate axes of FIG. 1B). In some embodiments, the rake teeth may extend in a direction that is substantially perpendicular to a plane of the build platform 114 (e.g., perpendicular to the plane formed by the x-axis and y-axis of the coordinate axes depicted in FIG. 1B). In another embodiment, the rake teeth may be slanted with respect to the build platform 114. An angle of the slanted rake teeth with respect to a normal to the build platform may be any value, and in some embodiments is between about 0° and about 45°. In some embodiments, each one of the plurality of rake teeth may be a metal foil or a metal sheet. The total length of the plurality of rake teeth may be longer than a width of the build platform 114 in order to make it possible to distribute powder on each position of the build platform 114. The rake teeth may also be shaped and sized to rake through the raw material to distribute the powder layer 118 on the build platform 114.

It should be understood that while the powder distributor 110 described herein generally extends a distance in the z direction of the coordinate axes depicted in FIG. 1B and moves in the +x/−x directions of the coordinate axes depicted in FIG. 1B to spread the powder layer 118 as described above, this is merely one illustrative example. Other configurations are also contemplated. For example, the powder distributor 110 may rotate about an axis to spread the powder layer 118, may articulate about one or more joints or the like to spread the powder layer 118, and/or the like without departing from the scope of the present disclosure.

In some embodiments, a cross section of the powder distributor 110 may be generally triangular, as depicted in FIG. 1B. However, it should be understood that the cross section may be any shape, including but not limited to, circular, elliptical, quadratic, polygonal (e.g., rectangular), or the like. A height of the powder distributor 110 may be set in order to give the powder distributor 110 a particular mechanical strength in the system vertical direction (e.g., along the +z/−z axis of the coordinate axes of FIG. 1B). That is, in some embodiments, the powder distributor 110 may have a particular controllable flex in the system vertical direction. The height of the powder distributor may also be selected taking into account that the powder distributor 110 pushes an amount of the raw material. If the height of the powder distributor 110 is too small, the powder distributor 110 can only push forward a smaller amount relative to a higher power powder distributor 110. However, if the height of the powder distributor 110 is too high, the powder distributor 110 may complicate the powder catching from a scree of powder, (e.g., the higher the height of the powder distributor 110, the more force may be required in order to catch a predetermined amount of powder from the scree of powder by moving the powder distributor 110 into the scree of powder and letting a predetermined amount of powder fall over the top of the powder distributor 110 from a first side in the direction of travel into the scree of powder to a second side in the direction of the build platform 114).

In some embodiments, the powder distributor 110 may be communicatively coupled to the analysis component 140, as depicted by the dashed line in FIGS. 1A-1B between the powder distributor 110 and the analysis component 140. As used herein, the term "communicatively coupled" generally refers to any link in a manner that facilitates communications. As such, "communicatively coupled" includes both wireless and wired communications, including those wireless and wired communications now known or later developed. As the powder distributor 110 is communicatively coupled to the analysis component 140, the analysis component 140 may transmit one or more signals, data, and/or the like to cause the powder distributor 110 to move, change direction, change speed, and/or the like. For example, a "reverse direction" signal transmitted by the analysis component 140 to the powder distributor 110 may cause the powder distributor 110 to reverse the direction in which it is moving (e.g., reverse movement in the +x direction of the coordinate axes of FIGS. 1A-1B to movement in the −x direction of the coordinate axes of FIGS. 1A-1B).

Each of the raw material hoppers 106, 107 may generally be containers that hold an amount of the raw material therein and contain an opening to dispense the raw material therefrom. While FIGS. 1A-1B depict two raw material hoppers 106, 107, the present disclosure is not limited to such. That is, any number of raw material hoppers may be utilized without departing from the scope of the present disclosure. Further, while FIGS. 1A-1B depict the raw material hoppers 106, 107 as being located within the interior 122 of the build chamber 120, the present disclosure is not limited to such. That is, the raw material hoppers 106, 107 may be located outside or partially outside the build chamber 120 in various other embodiments. However, it should be understood that if a raw material hopper is located outside or partially outside the build chamber 120, one or more outlets of the raw material hoppers that supply the raw material may be selectively sealed when not distributing the raw material in order to maintain the vacuum within the build chamber 120.

The shape and size of the raw material hoppers 106, 107 are not limited by the present disclosure. That is, the raw material hoppers 106, 107 may generally have any shape and or size without departing from the scope of the present disclosure. In some embodiments, each of the raw material hoppers 106, 107 may be shaped and or sized to conform to the dimensions of the build chamber 120 such that the raw material hoppers 106, 107 can fit inside the build chamber 120. In some embodiments, the raw material hoppers 106, 107 may be shaped and sized such that a collective volume of the raw material hoppers 106, 107 is sufficient to hold an amount of raw material that is necessary to fabricate the article 116 (FIG. 1B), which includes a sufficient amount of material to form each successive powder layer 118 (FIG. 1B) and additional material that makes up the unfused raw material.

Referring to FIG. 1B, the raw material hoppers 106, 107 may generally have an outlet for ejecting the raw material located within the raw material hoppers 106, 107 such that the raw material can be spread by the powder distributor 110, as described herein. In some embodiments, such as the embodiment depicted in FIG. 1B, the raw material may freely flow out of the raw material hoppers 106, 107 under the force of gravity, thereby forming piles or scree of raw material for the powder distributor 110 to spread. In other embodiments, the outlets of the raw material hoppers 106, 107 may be selectively closed via a selective closing mechanism so as to only distribute a portion of the raw material located within the respective raw material hoppers 106, 107 at a particular time. The selective closing mechanisms may be communicatively coupled to the analysis component 140 such that data and/or signals transmitted to/from the analysis component 140 can be used to selectively open and close the outlets of the raw material hoppers 106, 107.

The raw material contained within the raw material hoppers 106, 107 and used to form the article 116 is not limited by the present disclosure, and may generally be any raw material used for EBM now known or later developed. Illustrative examples of raw material includes, but is not limited to, pure metals such as titanium, aluminum, tungsten, or the like; and metal alloys such as titanium alloys, aluminum alloys, stainless steel, cobalt-chrome alloys, cobalt-chrome-tungsten alloys, nickel alloys, and/or the like. Specific examples of raw material include, but are not limited to, $Ti_6Al_4V$ titanium alloy, $Ti_6Al_4V$ ELI titanium alloy, Grade 2 titanium, and ASTM F75 cobalt-chrome (all available from Arcam AB, Molndal, Sweden). Another specific example of raw material is INCONEL® alloy 718 available from Special Metals Corporation (Huntington W. Va.).

In embodiments, the raw material is pre-alloyed, as opposed to a mixture. This may allow classification of EBM with selective laser melting (SLM), where other technologies like selective laser sintering (SLS) and direct metal laser sintering (DMLS) require thermal treatment after fabrication. Compared to selective laser melting (SLM) and DMLS, EBM has a generally superior build rate because of its higher energy density and scanning method.

Referring again to FIGS. 1A-1B, the EB guns 101, 102 are each generally a device that emits an electron beam (e.g., a charged particle beam), such as, for example, an electron gun, a linear accelerator, or the like. The EB guns 101, 102 each, respectively, generate a beam 151, 152 that may be used for melting or fusing together the raw material when spread as the powder layer 118 on the build platform 114.

Figure 2B:
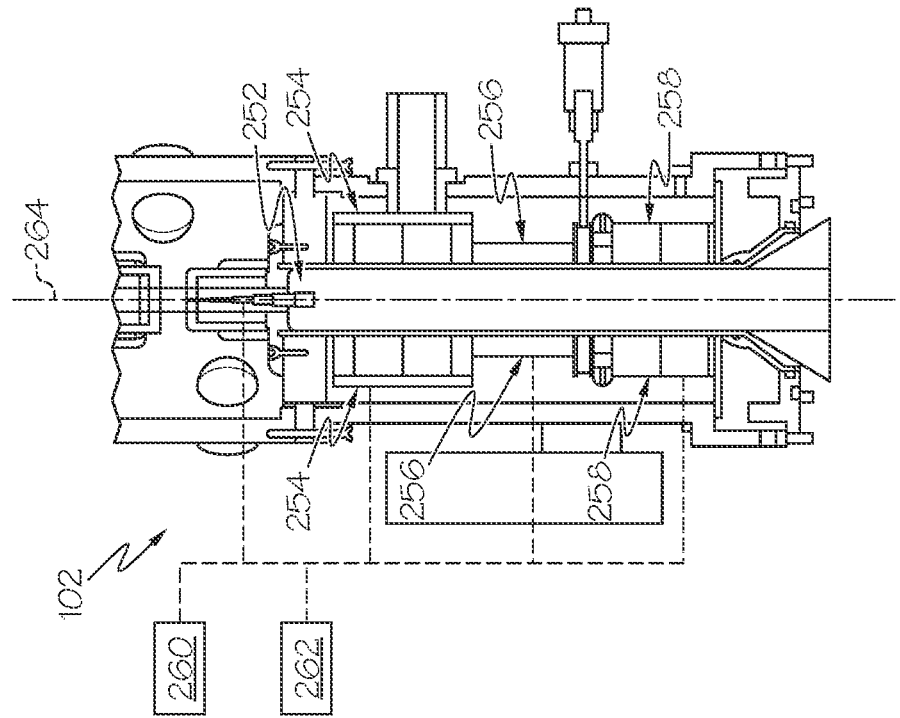
FIG. 2B schematically depicts a cutaway side view of an illustrative second electron beam emitter according to one or more embodiments shown and described herein.
Figure 2A:
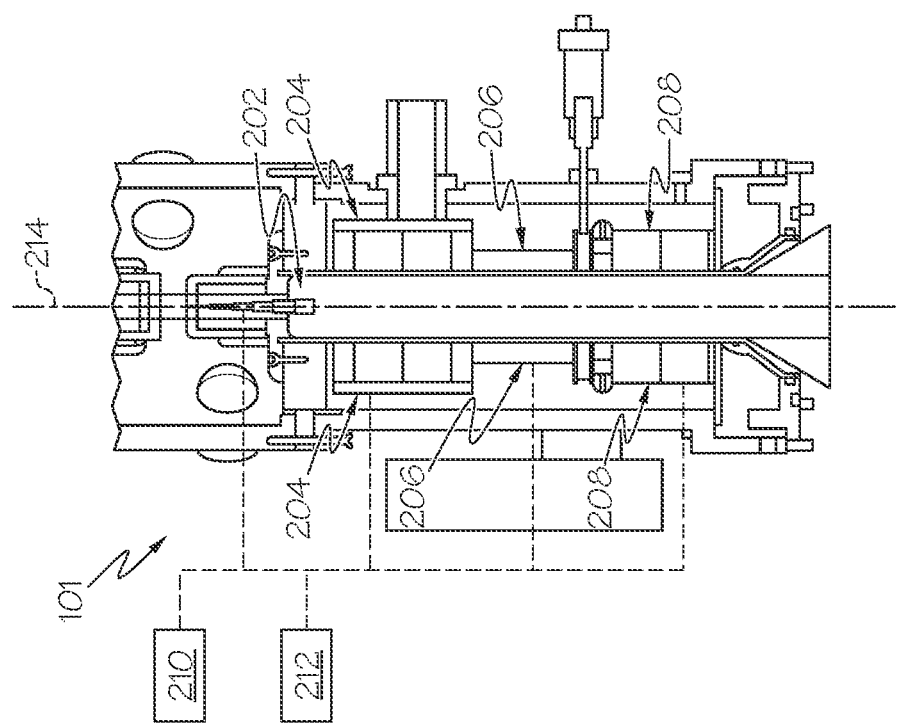
FIG. 2A schematically depicts a cutaway side view of an illustrative first electron beam emitter according to one or more embodiments shown and described herein.

Referring to FIGS. 1A-1B and 2A, in some embodiments, the first EB gun 101 includes an electron emitter 202, at least one focusing coil 206, and at least one deflection coil 208. In some embodiments, the first EB gun 101 may further include at least one astigmatism coil 204 (e.g., a stigmator). In still other embodiments, the first EB gun 101 may include a power supply 210, which may be electrically connected to at least one gun control unit 212, the electron emitter 202, the at least one astigmatism coil 204, the at least one focusing coil 206, and/or the at least one deflection coil 208. In some embodiments, the various components of the first EB gun 101 are arranged such that the at least one astigmatism coil 204, the at least one focusing coil 206, and the at least one deflection coil 208 are positioned relative to the electron emitter 202 such that electrons emitted by the electron emitter 202 are passed through a void defined by each of the coils 204, 206, 208. In the embodiment depicted in FIG. 2A, the at least one astigmatism coil 204 may be positioned closest to the electron emitter 202 relative to the focusing coil 206 and the deflecting coil 208, the focusing coil 206 may be positioned closer to the electron emitter 202 relative to the deflecting coil 208, and the deflecting coil 208 may be positioned farthest away from the electron emitter 202. However, this is merely illustrative, and other positions of the various coils relative to the electron emitter 202 are contemplated and included within the scope of the present disclosure.

The electron emitter 202 is generally an electron beam emitting component containing a filament/cathode and/or an anode electrically coupled to the power supply 210 via the gun control unit 212. The electron emitter 202 emits electrons into free space generally in a direction towards a space defined in the center of the coils 204, 206, 208 as a result of application of an electric current generated by the power supply 210. That is, the electrons emitted by the electron emitter 202 are generally directed in the direction indicated by dashed line 214 in FIG. 2A. In some embodiments, to ensure a directed emission of electrons therefrom, the electron emitter 202 may be formed into a particular shape that is adapted for such an electron emission. For example, the electron emitter 202 may be formed in a loop, as a tip having a particular radius of curvature, as one or more legs spaced apart from one another, and/or the like. The electron emitter 202 may be constructed of a particular material for emitting electrons, such as, for example, tungsten (W), lanthanum hexaboride ($LaB_6$), or the like. In some embodiments, the electron emitter 202 may be formed as the result of an etching process. An illustrative electron emitter may be provided by Energy Beam Sciences, Inc. (East Granby, Conn.). In one illustrative embodiment, the electron emitter 202 may produce a focusable electron beam with an accelerating voltage of about 60 kilovolts (kV) and with a beam power in the range of about 0 kilowatts (kW) to about 10 kW. It should be understood that the various features of the electron emitter 202 are merely illustrative, and that other features are also contemplated.

The at least one focusing coil 206 is generally a coil of electrically conductive material that has a plurality of turns/ windings and is electrically coupled to a power source (e.g., the power supply 210). The at least one focusing coil 206 is positioned relative to the electron emitter 202 such that electrons emitted by the electron emitter are passed through a center of the at least one focusing coil 206 (e.g., a void defined by the plurality of turns/windings of the at least one focusing coil 206). That is, the at least one focusing coil 206 is oriented transverse to an axis defined by the dashed line 214 depicted in FIG. 2A. The arrangement and location of the at least one focusing coil 206 relative to the electron emitter 202 and/or the shape and size of the plurality of turns/windings may be such that, when an electrical current is applied across the at least one focusing coil 206, a magnetic field is generated in the void defined by the turns/windings. The magnetic field acts as a lens for the electrons emitted by the electron emitter 202, converging the electrons into an electron beam having a single focal point. As such, modification of the electrical current applied across the at least one focusing coil 206 alters the magnetic field, which in turn alters the focal point of the electron beam.

The at least one deflection coil 208 is generally a coil of electrically conductive material that has a plurality of turns/ windings and is electrically coupled to a power source (e.g., the power supply 210). The at least one deflection coil 208 is positioned relative to the electron emitter 202 and/or the at least one focusing coil 206 such that electrons emitted by the electron emitter 202 and focused into a beam by the at least one focusing coil 206 are passed through a center of the at least one deflection coil 208 (e.g., a void defined by the plurality of turns/windings of the at least one deflection coil 208). That is, the at least one deflection coil 208 is oriented transverse to an axis defined by the dashed line 214 depicted in FIG. 2A. The arrangement and location of the at least one deflection coil 208 relative to the electron emitter 202 and/or the at least one focusing coil 206 and/or the shape and size of the plurality of turns/windings may be such that, when an electrical current is applied across the at least one deflection coil 208, a magnetic field and/or an electrical field is generated in the void defined by the turns/windings. The magnetic field and/or electrical field acts to direct the electron beam emitted by the electron emitter 202 and focused by the at least one focusing coil 206, causing the electron beam to be directed to a particular location based on the characteristics of the magnetic field and/or electrical field. As such, modification of the electrical current applied across the at least one deflection coil 208 alters the magnetic field and/or electrical field, which in turn alters the path of travel of the electron beam.

The at least one astigmatism coil 204 is generally a coil of electrically conductive material that has a plurality of turns/windings and is electrically coupled to a power source (e.g., the power supply 210). The at least one astigmatism coil 204 is positioned relative to the electron emitter 202 such that electrons emitted by the electron emitter 202 are passed through a center of the at least one astigmatism coil 204 (e.g., a void defined by the plurality of turns/windings of the at least one astigmatism coil 204). That is, the at least one astigmatism coil 204 is oriented transverse to an axis defined by the dashed line 214 depicted in FIG. 2A. The arrangement and location of the at least one astigmatism coil 204 relative to the electron emitter 202 and/or the shape and size of the plurality of turns/windings may be such that, when an electrical current is applied across the at least one astigmatism coil 204, a magnetic field is generated in the void defined by the turns/windings. The magnetic field acts to correct any focus defects present in the electrons emitted by the electron emitter 202, causing the electrons to converge in a beam that is radially uniform. As such, modification of the electrical current applied across the at least one astigmatism coil 204 alters the magnetic field, which in turn alters the electron beam distortion.

The various coils depicted in FIG. 2A (e.g., the at least one astigmatism coil 204, the at least one focusing coil 206, and the at least one deflection coil 208) are generally unshielded. That is, an iron shroud or similar shielding device, which is typical for coils in other EB guns, may not be present around one or more of the coils of the first EB gun 101 in some embodiments. The omission of the shielding around the various coils depicted in FIG. 2A allows for the EB gun 101 to be optimized for speed rather than sensitivity. This is because shielding typically introduces more inductance, but makes focus response slow (e.g., when the shielding is present around the focusing coil 206). The lack of sensitivity optimization due to shielding is offset by the calibration process described herein. In some embodiments, one or more of the various coils may be surrounded by a reflector coil that is fed with the same current fed to the various coils, but in an opposite direction, such that the magnetic fields outside the various coils is canceled out.

While the embodiment of FIG. 2A only depicts three coils (e.g., the at least one astigmatism coil 204, the at least one focusing coil 206, and the at least one deflection coil 208), it should be understood that this is merely illustrative. Fewer or additional coils may be included within the EB gun 101 without departing from the scope of the present disclosure. In one particular embodiment, the EB gun 101 may include six coils therein, where at least one of the six coils is a focusing coil and at least one of the six coils is a deflection coil.

The power supply 210 is generally any component that provides electrical power to the components of the first EB gun 101 (e.g., the electron emitter 202, the at least one astigmatism coil 204, the at least one focusing coil 206, and/or the at least one deflection coil 208). The power supply 210 may have a plurality of power outputs, each of the plurality of power outputs coupled to one of the components of the first EB gun 101. As such, the power supply 210 can modulate the electricity provided to each of the component of the first EB gun 101 independently of one another. That is, a first voltage, frequency, and/or the like can be provided to a first component of the first EB gun 101 and a second voltage, frequency, and/or the like can be provided to a second component of the first EB gun 101. Control of the electricity provided to the various components of the first EB gun 101 may be achieved by the gun control unit 212, which is electrically coupled to the power supply 210 and/or each of the components of the first EB gun 101 (e.g., the electron emitter 202, the at least one astigmatism coil 204, the at least one focusing coil 206, and/or the at least one deflection coil 208). That is, the gun control unit 212 controls the electricity provided to each of the components of the first EB gun 101 to ensure that a particular voltage, a particular frequency, and/or the like is supplied to each component of the first EB gun 101 to ensure a particular control of the characteristics of the electron beam emitted by the first EB gun 101.

In some embodiments, the power supply 210 is a Tesla transformer, as it produces multi-megavolt pulses of very high power (e.g., on the order of tens of megawatts). In embodiments, the pulse repetition rate may be about twice the frequency of the supply mains, and may be limited only by a deionization time of a single spark-gap switch. When a high-voltage pulse is applied by the power supply 210, driving a cathode of the electron emitter 202 to a large negative potential, the electric field at the cathode face becomes so great that emission of electrons occurs. The electrons may be released normal to the face of the cathode and are accelerated through an evacuated region of a gun barrel of the first EB gun 101 by the electric field of the cathode through the magnetic fields and/or electrical fields produced by the various coils 204, 206, 208.

While only a single power supply 210 is depicted in FIG. 2A, it should be understood that a plurality of power supplies may also be used without departing from the scope of the present disclosure. That is, the first EB gun 101 may have a dedicated power supply for each of the components thereof in some embodiments. For example, the electron emitter 202 may have a first power supply and the various coils 204, 206, 208 may have a second power supply coupled thereto. In another example, the electron emitter 202 may have a first power supply coupled thereto, the at least one astigmatism coil 204 may have a second power supply coupled thereto, the at least one focusing coil 206 may have a third power supply coupled thereto, and the at least one deflection coil 208 may have a fourth power supply coupled thereto.

It should be understood that the first EB gun 101 may include other components that are not specifically recited herein. In a nonlimiting example, the first EB gun 101 may further include one or more focusing lens, one or more astigmatic lenses, one or more deflection lenses, one or more pumps (e.g., turbo pumps), one or more gate valves, one or more apertures, and/or the like. In some embodiments, the first EB gun 101 may include a plurality of columns (e.g., an upper column arranged above a lower column). Such columns may include a pressure differential therebetween (e.g., a pressure differential of about $10^{-4}$ mbar).

Referring to FIGS. 1A-1B and 2B, in some embodiments, the second EB gun 102 includes an electron emitter 252, at least one focusing coil 256, and at least one deflection coil 258. In some embodiments, the second EB gun 102 may further include at least one astigmatism coil 254 (e.g., a stigmator). In still other embodiments, the second EB gun 102 may include a power supply 260, which may be electrically connected to at least one gun control unit 262, the electron emitter 252, the at least one astigmatism coil 254, the at least one focusing coil 256, and/or the at least one deflection coil 258. In some embodiments, the various components of the second EB gun 102 are arranged such that the at least one astigmatism coil 254, the at least one focusing coil 256, and the at least one deflection coil 258 are positioned relative to the electron emitter 252 such that electrons emitted by the electron emitter 252 are passed through a void defined by each of the coils 254, 256, 258. In the embodiment depicted in FIG. 2B, the at least one astigmatism coil 254 may be positioned closest to the electron emitter 252 relative to the focusing coil 256 and the deflecting coil 258, and the focusing coil 256 may be positioned closer to the electron emitter 252 relative to the deflecting coil 258. However, this is merely illustrative, and other positions of the various coils relative to the electron emitter 252 are contemplated and included within the scope of the present disclosure.

The electron emitter 252 is generally an electron beam emitting component containing a filament/cathode and/or an anode electrically coupled to the power supply 260 via the gun control unit 262. The electron emitter 252 emits electrons into free space generally in a direction towards a space defined in the center of the coils 254, 256, 258 as a result of application of an electric current generated by the power supply 260. That is, the electrons emitted by the electron emitter 252 are generally directed in the direction indicated by dashed line 264 in FIG. 2B. In some embodiments, to ensure a directed emission of electrons therefrom, the electron emitter 252 may be formed into a particular shape that is adapted for such an electron emission. For example, the electron emitter 252 may be formed in a loop, as a tip having a particular radius of curvature, as one or more legs spaced apart from one another, and/or the like. The electron emitter 252 may be constructed of a particular material for emitting electrons, such as, for example, tungsten (W), lanthanum hexaboride ($LaB_6$), or the like. In some embodiments, the electron emitter 252 may be formed as the result of an etching process. An illustrative electron emitter may be provided by Energy Beam Sciences, Inc. (East Granby, Conn.). In one illustrative embodiment, the electron emitter 252 may produce a focusable electron beam with an accelerating voltage of about 60 kilovolts (kV) and with a beam power in the range of about 0 kilowatts (kW) to about 10 kW. It should be understood that the various features of the electron emitter 252 are merely illustrative, and that other features are also contemplated.

The at least one focusing coil 256 is generally a coil of electrically conductive material that has a plurality of turns/windings and is electrically coupled to a power source (e.g., the power supply 260). The at least one focusing coil 256 is positioned relative to the electron emitter 252 such that electrons emitted by the electron emitter are passed through a center of the at least one focusing coil 256 (e.g., a void defined by the plurality of turns/windings of the at least one focusing coil 256). That is, the at least one focusing coil 256 is oriented transverse to an axis defined by the dashed line 264 depicted in FIG. 2B. The arrangement and location of the at least one focusing coil 256 relative to the electron emitter 252 and/or the shape and size of the plurality of turns/windings may be such that, when an electrical current is applied across the at least one focusing coil 256, a magnetic field is generated in the void defined by the turns/windings. The magnetic field acts as a lens for the electrons emitted by the electron emitter 252, converging the electrons into an electron beam having a single focal point. As such, modification of the electrical current applied across the at least one focusing coil 256 alters the magnetic field, which in turn alters the focal point of the electron beam.

The at least one deflection coil 258 is generally a coil of electrically conductive material that has a plurality of turns/windings and is electrically coupled to a power source (e.g., the power supply 260). The at least one deflection coil 258 is positioned relative to the electron emitter 252 and/or the at least one focusing coil 256 such that electrons emitted by the electron emitter 252 and focused into a beam by the at least one focusing coil 256 are passed through a center of the at least one deflection coil 258 (e.g., a void defined by the plurality of turns/windings of the at least one deflection coil 258). That is, the at least one deflection coil 258 is oriented transverse to an axis defined by the dashed line 264 depicted in FIG. 2B. The arrangement and location of the at least one deflection coil 258 relative to the electron emitter 252 and/or the at least one focusing coil 256 and/or the shape and size of the plurality of turns/windings may be such that, when an electrical current is applied across the at least one deflection coil 258, a magnetic field and/or an electrical field is generated in the void defined by the turns/windings. The magnetic field and/or electrical field acts to direct the electron beam emitted by the electron emitter 252 and focused by the at least one focusing coil 256, causing the electron beam to be directed to a particular location based on the characteristics of the magnetic field and/or electrical field. As such, modification of the electrical current applied across the at least one deflection coil 258 alters the magnetic field and/or electrical field, which in turn alters the path of travel of the electron beam.

The at least one astigmatism coil 254 is generally a coil of electrically conductive material that has a plurality of turns/windings and is electrically coupled to a power source (e.g., the power supply 260). The at least one astigmatism coil 254 is positioned relative to the electron emitter 252 such that electrons emitted by the electron emitter 252 are passed through a center of the at least one astigmatism coil 254 (e.g., a void defined by the plurality of turns/windings of the at least one astigmatism coil 254). That is, the at least one astigmatism coil 254 is oriented transverse to an axis defined by the dashed line 264 depicted in FIG. 2B. The arrangement and location of the at least one astigmatism coil 254 relative to the electron emitter 252 and/or the shape and size of the plurality of turns/windings may be such that, when an electrical current is applied across the at least one astigmatism coil 254, a magnetic field is generated in the void defined by the turns/windings. The magnetic field acts to correct any focus defects present in the electrons emitted by the electron emitter 252, causing the electrons to converge in a beam that is radially uniform. As such, modification of the electrical current applied across the at least one astigmatism coil 254 alters the magnetic field, which in turn alters the electron beam distortion.

The various coils depicted in FIG. 2B (e.g., the at least one astigmatism coil 254, the at least one focusing coil 256, and the at least one deflection coil 258) are generally unshielded. That is, an iron shroud or similar shielding device, which is typical for coils in other EB guns, may not be present around one or more of the coils of the second EB gun 102. The omission of the shielding around the various coils depicted in FIG. 2B allows for the EB gun 102 to be optimized for speed rather than sensitivity. This is because shielding typically introduces more inductance, but makes focus response slow (e.g., when the shielding is present around the focusing coil 256). The lack of sensitivity optimization due to shielding is offset by the calibration process described herein. In some embodiments, one or more of the various coils may be surrounded by a reflector coil that is fed with the same current fed to the various coils, but in an opposite direction, such that the magnetic fields outside the various coils is canceled out.

While the embodiment of FIG. 2B only depicts three coils (e.g., the at least one astigmatism coil 254, the at least one focusing coil 256, and the at least one deflection coil 258), it should be understood that this is merely illustrative. Fewer or additional coils may be included within the EB gun 102 without departing from the scope of the present disclosure. In one particular embodiment, the EB gun 102 may include six coils therein, where at least one of the six coils is a focusing coil and at least one of the six coils is a deflection coil.

The power supply 260 is generally any component that provides electrical power to the components of the second EB gun 102 (e.g., the electron emitter 252, the at least one astigmatism coil 254, the at least one focusing coil 256, and/or the at least one deflection coil 258). The power supply 260 may have a plurality of power outputs, each of the plurality of power outputs coupled to one of the components of the second EB gun 102. As such, the power supply 260 can modulate the electricity provided to each of the component of the second EB gun 102 independently of one another. That is, a first voltage, frequency, and/or the like can be provided to a first component of the second EB gun 102 and a second voltage, frequency, and/or the like can be provided to a second component of the second EB gun 102. Control of the electricity provided to the various components of the second EB gun 102 may be achieved by the gun control unit 262, which is electrically coupled to the power supply 260 and/or each of the components of the second EB gun 102 (e.g., the electron emitter 252, the at least one astigmatism coil 254, the at least one focusing coil 256, and/or the at least one deflection coil 258). That is, the gun control unit 262 controls the electricity provided to each of the components of the second EB gun 102 to ensure that a particular voltage, a particular frequency, and/or the like is supplied to each component of the second EB gun 102 to ensure a particular control of the characteristics of the electron beam emitted by the second EB gun 102.

In some embodiments, the power supply 260 is a Tesla transformer, as it produces multi-megavolt pulses of very high power (e.g., on the order of tens of megawatts). In embodiments, the pulse repetition rate may be about twice the frequency of the supply mains, and may be limited only by a deionization time of a single spark-gap switch. When a high-voltage pulse is applied by the power supply 260, driving a cathode of the electron emitter 252 to a large negative potential, the electric field at the cathode face becomes so great that emission of electrons occurs. The electrons may be released normal to the face of the cathode and are accelerated through an evacuated region of a gun barrel of the second EB gun 102 by the electric field of the cathode through the magnetic fields and/or electrical fields produced by the various coils 254, 256, 258.

While only a single power supply 260 is depicted in FIG. 2B, it should be understood that a plurality of power supplies may also be used without departing from the scope of the present disclosure. That is, the second EB gun 102 may have a dedicated power supply for each of the components thereof in some embodiments. For example, the electron emitter 252 may have a first power supply and the various coils 254, 256, 258 may have a second power supply coupled thereto. In another example, the electron emitter 252 may have a first power supply coupled thereto, the at least one astigmatism coil 254 may have a second power supply coupled thereto, the at least one focusing coil 256 may have a third power supply coupled thereto, and the at least one deflection coil 258 may have a fourth power supply coupled thereto.

It should be understood that the second EB gun 102 may include other components that are not specifically recited herein. In a nonlimiting example, the second EB gun 102 may further include one or more focusing lens, one or more astigmatic lenses, one or more deflection lenses, one or more pumps (e.g., turbo pumps), one or more gate valves, one or more apertures, and/or the like. In some embodiments, the second EB gun 102 may include a plurality of columns (e.g., an upper column arranged above a lower column). Such columns may include a pressure differential therebetween (e.g., a pressure differential of about $10^{-4}$ mbar).

Referring again to FIGS. 1A-1B, the pressure in the build chamber 120 may be in the range of from about $1 \times 10^{-3}$ mBar to about $1 \times 10^{-6}$ mBar when forming the article 116 by fusing each successive powder layer 118 with the beams 151, 152. In some embodiments, the EB guns 101, 102 may be communicatively coupled to the analysis component 140, as indicated in FIGS. 1A-1B by the dashed line between the first EB gun 101 and the analysis component 140 and the dashed line between the second EB gun 102 and the analysis component 140. The communicative coupling of the EB guns 101, 102 to the analysis component 140 may provide an ability for signals and/or data to be transmitted between the EB guns 101, 102 and the analysis component 140, such as control signals from the analysis component 140 that direct operation of the EB guns 101, 102. That is, the analysis component 140 may transmit one or more signals to each of the EB guns 101, 102, the one or more signals directing operation of the EB guns 101, 102 independently of one another such that the EB guns 101, 102 can separately emit their respective beams 151, 152. However, due to the calibration processes and the calibrated movements and emissions of the EB guns 101, 102 described herein, the emission of the beams 151, 152 may be provided in such a manner to ensure operation of the EB guns 101, 102 in tandem with one another without causing interference and without the need for shielding.

The imaging device 108 is generally located in an area within or adjacent to the build chamber 120 and positioned to obtain information regarding the each of the beams 151, 152 and/or information regarding emissions 153, 154 that result from impingement of the beams 151, 152 on various surfaces. In some embodiments, the imaging device 108 may be an x-ray unit configured to obtain x-ray radiation emitted by impingement of the beams 151, 152 on the surface, as described herein. In some embodiments, the imaging device 108 may be an imaging device configured to obtain images of the beams 151, 152 as they impinge on a surface, as described herein. In some embodiments, the imaging device 108 may be located in the exterior environment 123 outside the build chamber 120, yet positioned such that the field of view or sensed area of the imaging device 108 captures an area within the build chamber 120, such as a point of contact between each of the beams 151, 152 and a target, such as the build platform 114 and/or the powder layer 118. It should be understood that in such embodiments, the one or more chamber walls 121 of the build chamber 120 may include a window or the like such that the imaging device 108 can be positioned adjacent to the window to capture the one or more images. In the embodiments where the imaging device 108 is positioned outside the build chamber 120, the harsh environment within the interior 122 of the build chamber 120 does not affect operation of the imaging device 108. That is, the heat, dust, metallization, and/or the like that occurs within the interior 104 of the build chamber 120 will not affect operation of the imaging device 108. In some embodiments, the imaging device 108 is fixed in position such that a field of view or sensed area thereof remains constant (e.g., does not change). In such embodiments, the imaging device 108 is arranged in the fixed position such that a field of view or sensed area of the imaging device 108 encompasses an entirety of the build envelope 112. That is, the imaging device 108 is capable of imaging or otherwise sensing the entire build envelope 112 within the build chamber 120. However, this is not a requirement and in other embodiments, the imaging device 108 may have a field of view that does not encompass an entirety of the build envelope 112 (e.g., embodiments employing a plurality of imaging devices 108 and/or embodiments employing imaging devices that are movable, have adjustable optical components, and/or the like).

In some embodiments, the imaging device 108 is a device configured to sense one or more characteristics of the beams 151, 152 and/or the emissions 153, 154. For example, in some embodiments, the imaging device 108 may be configured to sense electromagnetic radiation, such as an x-ray response generated as a result of impingement of the beams 151, 152 with the surface within the build chamber 120. Thus, the imaging device 108 may generally be a device particularly tuned or otherwise configured to obtain information pertaining to the x-rays generated, such as a commercially available x-ray sensor or the like. As a result of the x-rays generated due to impingement of the electron beams 151, 152 on the surface within the build chamber 120, the imaging device 108 may record the x-ray response, which can be used to determine a shape and fit the shape to a mathematical expression. The mathematical expression may be used to determine a beam spot size of the beams 151, 152 impinging on the surface within the build chamber 120, which can be used to for the purposes of calibration, as described in greater detail herein.

In some embodiments, the imaging device 108 may be configured to sense an electrical response generated as a result of impingement of the electron beams 151, 152 on the surface within the build chamber 120. In some embodiments, the imaging device 108 may be configured to sense back scattered electrons generated as a result of impingement of the electron beams 151, 152 on the surface within the build chamber 120. In some embodiments, the imaging device 108 may be configured to sense photonic signals generated as a result of impingement of the electron beams 151, 152 on the surface within the build chamber 120. In some embodiments, the imaging device 108 may be configured to sense any combination of the aforementioned characteristics that result of impingement of the electron beams 151, 152 on the surface within the build chamber 120, including (but not limited to) any combination of x-rays, electrical response, back scattered electrons, and photonic signals. As such, the imaging device 108 may include one or more sensors therein. In some embodiments, the imaging device 108 may include a signal processing unit or the like. For example, the imaging device 108 may include a diode type sensor that transforms x-rays into electrical signals. A signal processing unit may then be used to filter and amplify the electrical signals before transmission of the signals to an analyzing device, such as, for example, the analysis component 140.

In some embodiments, the imaging device 108 may be a camera (e.g., a calibration camera) or the like. As such, the imaging device 108 may obtain one or more images of the interior 104 of the build chamber 120. In some embodiments, the imaging device 108 may generally be configured for sensing a heat response generated as a result of impingement of the electron beams 151, 152 on a surface and/or for sensing electromagnetic radiation generated as a result of impingement of the electron beams 151, 152 on a surface. For example, the imaging device 108 may be particularly configured (e.g., via components such as filters, image sensors, and/or the like) to obtain information in the infrared (IR) spectrum, the near infrared (NIR) spectrum, and/or the visible spectrum. In some embodiments, the imaging device 108 may be a pre-calibrated imaging device that is particularly calibrated for use as described herein.

In some embodiments, the imaging device 108 may further be a device particularly configured to provide signals and/or data corresponding to the captured images, the mathematical expression, and/or the beam spot size to the analysis component 140. As such, the imaging device 108 may be communicatively coupled to the analysis component 140, as indicated by the dashed lines depicted in FIG. 1A between the imaging device 108 and the analysis component 140.

Still referring to FIG. 1A, the imaging device 108, when arranged and configured such that, when the electron beams 151, 152 impinge a particular portion of the build platform 114, a calibration component disposed on the build platform 114, and/or the article 116, an area of contact (as well as characteristics of the area of contact) are captured by the imaging device 108, which can be used in conjunction with a reference point (or reference points) to determine one or more coordinates (e.g., x and y coordinates) of the area of contact. As the beams 151, 152 move to impinge on various parts of the build platform 114, a calibration component disposed on the build platform 114, and/or the article 116 (e.g., moves between various surface features), the movement of the area of contact may be captured as one or more subsequent images by the imaging device 108, which can also be used to determine one or more coordinates (e.g., x and y coordinates of the area of contact). Additional details regarding operation of the imaging device 108 for the purposes of calibration will be discussed in greater detail below.

It should be understood that, due to the ability to remove the imaging device 108 (as depicted in FIG. 1B for example) it is possible to easily retrofit existing build chambers with a kit that includes the imaging device 108 so as to upgrade the existing build chambers with the capabilities described herein.

The analysis component 140 is generally a device that is communicatively coupled to one or more components of the additive manufacturing system 100 (e.g., the powder distributor 110, the imaging device 108, and/or each of the EB guns 101, 102) and is particularly arranged and configured to transmit and/or receive signals and/or data to/from the one or more components of the additive manufacturing system 100. Additional details regarding the analysis component 140 are discussed herein with respect to FIGS. 3A-3B.

Figure 3A:
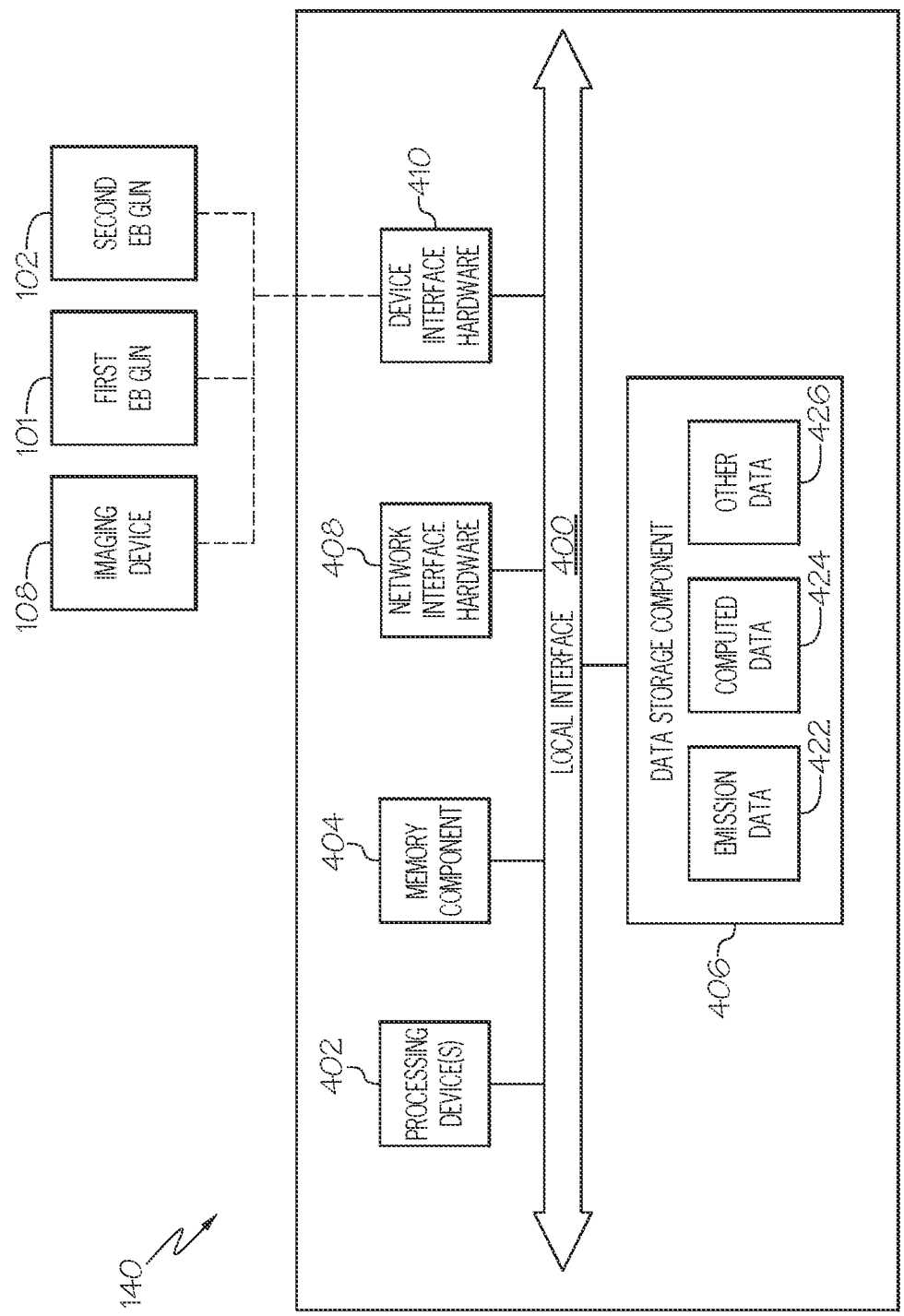
FIG. 3A schematically depicts a block diagram of illustrative components contained within a control unit according to one or more embodiments shown and described herein.

Turning to FIG. 3A, the various internal components of the analysis component 140 depicted in FIGS. 1A-1B is shown. Particularly, FIG. 3A depicts various system components for analyzing data received from the imaging device 108 and/or assisting with the control of various components of the additive manufacturing system 100 depicted in FIGS. 1A-1B.

As illustrated in FIG. 3A, the analysis component 140 may include one or more processing devices 402, a non-transitory memory component 404, network interface hardware 408, device interface hardware 410, and a data storage component 406. A local interface 400, such as a bus or the like, may interconnect the various components.

The one or more processing devices 402, such as a computer processing unit (CPU), may be the central processing unit of the analysis component 140, performing calculations and logic operations to execute a program. The one or more processing devices 402, alone or in conjunction with the other components, are illustrative processing devices, computing devices, processors, or combinations thereof. The one or more processing devices 402 may include any processing component configured to receive and execute instructions (such as from the data storage component 406 and/or the memory component 404).

The memory component 404 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The memory component 404 may include one or more programming instructions thereon that, when executed by the one or more processing devices 402, cause the one or more processing devices 402 to complete various processes, such as the processes described herein with respect to FIGS. 5-6 and 9.

Figure 3B:
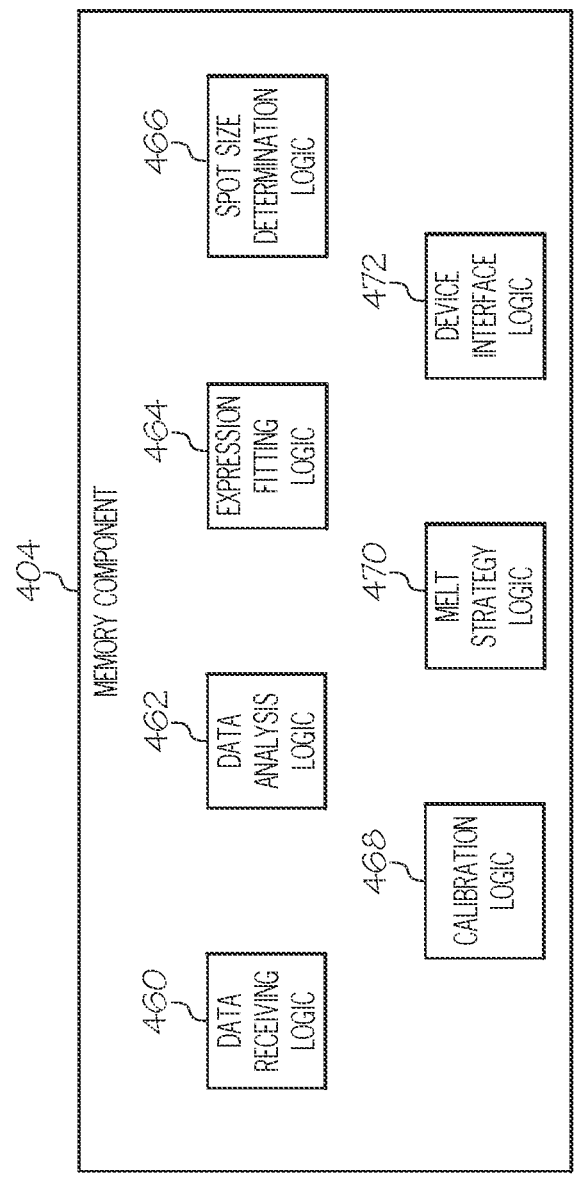
FIG. 3B depicts a block diagram of illustrative modules contained within a memory component of a control unit according to one or more embodiments shown and described herein.

Still referring to FIG. 3A, the programming instructions stored on the memory component 404 may be embodied as a plurality of software logic modules, where each logic module provides programming instructions for completing one or more tasks. FIG. 3B depicts the various modules of the memory component 404 of FIG. 3A according to various embodiments.

As shown in FIG. 3B, the memory component 404 includes a plurality of logic modules. Each of the logic modules shown in FIG. 3B may be embodied as a computer program, firmware, or hardware, as an example. Illustrative examples of logic modules present in the memory component 404 include, but are not limited to, data receiving logic 460, data analysis logic 462, expression fitting logic 464, spot size determination logic 466, calibration logic 468, melt strategy logic 470, and/or device interface logic 472.

Referring to FIGS. 3A and 3B, the data receiving logic 460 includes one or more programming instructions for receiving data from the imaging device 108. That is, the data receiving logic 460 may cause a connection between the device interface hardware 410 and the imaging device 108 such that data transmitted by the imaging device 108 is received by the analysis component 140. Further, the data transmitted by the imaging device 108 may be stored (e.g., within the data storage component 406).

Referring to FIGS. 1A and 3B, the data analysis logic 462 includes one or more programming instructions for analyzing the data received from the imaging device 108. That is, the data analysis logic 462 contains programming for analyzing the data received from the imaging device 108 that corresponds to the detected x-ray emissions that result from impingement of the beams 151, 152 on a surface and/or images of an area corresponding to a location of contact of the beams 151, 152 on the surface, as described herein. The data analysis logic 462 may further include programming instructions for analyzing data continuously as each of the beams 151, 152 moves relative to the surface and impinge on the surface.

Still referring to FIGS. 1A and 3B, the expression fitting logic 464 includes one or more programming instructions for fitting the data corresponding to the x-ray emissions and/or images resulting from impingement of the beams 151, 152 on a surface to a mathematical expression. That is, the expression fitting logic 464 may include an image analysis algorithm that is configured to convert the thermal image to a spot size.

Still referring to FIGS. 1A and 3B, the spot size determination logic 466 includes one or more programming instructions for determining the size of the beam spot. That is, the spot size determination logic 466 may contain programming usable to take the data generated by the expression fitting logic 464 and determine a slope of the response. When the beam speed (e.g., the speed of movement of the electron beams 151, 152 across an impinged surface) is known (e.g., from data provided by the EB guns 101, 102), the slope of the response can be used to determine a spot size.

Referring to FIGS. 1A, 2A-2B and 3B, the calibration logic 468 includes one or more programming instructions for calibrating the EB guns 101, 102 such that movement of the guns is completed in a coordinated manner to avoid or minimize interaction of the respective beams 151, 152 emitted therefrom. That is, the calibration logic 468 may contain programming instructions for receiving information from the expression fitting logic 464 and/or the spot size determination logic 466, determining particular coil settings for each of the coils 204, 206, 208 of the first EB gun 101 that would minimize or avoid interaction of the first beam 151 with the second beam 152 based on anticipated movements of the first EB gun 101 and the second EB gun 102, determining particular coil settings for each of the coils 254, 256, 258 of the second EB gun 102 that would minimize or avoid interaction of the second beam 152 with the first beam 151 based on anticipated movements of the second EB gun 102 and the first EB gun 101, and transmitting one or more instructions to the first EB gun 101 and/or the second EB gun 102 to adjust the various settings of the respective coils thereof according to determined particular coil settings. In embodiments, the one or more programming instructions for transmitting one or more instructions to the first EB gun 101 and/or the second EB gun 102 may include transmitting instructions to the one or more power supplies 210, 260 and/or the gun control units 212, 262 of the respective EB guns 101, 102.

Referring to FIGS. 1A-1B and 3B, in some embodiments, calibrating the EB guns 101, 102 (e.g., directing adjustment of the settings of the various coils 204, 206, 208 and 254, 256, 258 thereof) using the calibration logic 468 may be completed according to a particular melt strategy to be completed. That is, an anticipated target location of the beams 151, 152 emitted from the respective EB guns 101, 102 throughout a melting process may be determined prior to calibrating the EB guns 101, 102 such that the locations are factored into the calibration process. As such, the melt strategy logic 470 includes programming instructions for determining a programmed movement of the EB guns 101, 102, determining a precision mode to be used at particular times for each of the EB guns 101, 102, and transmitting instructions to each of the EB guns 101, 102 accordingly, as described in greater detail herein.

Referring to FIGS. 1A-1B and 3A-3B, the device interface logic 472 includes one or more programming instructions for establishing communicative connections with the various devices or components of the additive manufacturing system 100. For example, the device interface logic 472 may include programming instructions usable to establish connections with the powder distributor 110, the first EB gun 101, and/or the second EB gun 102 in various embodiments. In another example, the device interface logic 472 may contain programming instructions for working in tandem with the programming instructions of the data receiving logic 460 to establish connections with the imaging device 108.

Referring again to FIG. 3A, the network interface hardware 408 may include any wired or wireless networking hardware, such as a modem, LAN port, wireless fidelity (Wi-Fi) card, WiMax card, long term evolution (LTE) card, mobile communications hardware, and/or other hardware for communicating with other networks and/or devices. For example, the network interface hardware 408 may be used to facilitate communication between external storage devices, user computing devices, server computing devices, external control devices, and/or the like via a network, such as, for example, a local network, the Internet, and/or the like, as described herein with respect to FIG. 4.

Referring to FIGS. 1A-1B, 2A-2B, and 3A, the device interface hardware 410 may communicate information between the local interface 400 and one or more components of the additive manufacturing system 100 of FIGS. 1A-1B, particularly the imaging device 108, the first EB gun 101, and/or the second EB gun 102. In some embodiments, the device interface hardware 410 may transmit or receive signals and/or data to/from the first EB gun 101 and/or the second EB gun 102, transmit control signals to one or more of the gun control units 212, 264 to effect control of the EB guns 101, 102 and/or components thereof (e.g., the coils 204, 206, 208 of the first EB gun 101, the coils 254, 256, 258 of the second EB gun 102, the one or more power supplies 210 of the first EB gun 101, the one or more power supplies 260 of the second EB gun 102, the electron emitter 202 of the first EB gun 101, the electron emitter 252 of the second EB gun 102, and/or the like). In some embodiments, the device interface hardware 410 may transmit or receive signals and/or data to/from the imaging device 108.

Referring again to FIG. 3A, the data storage component 406, which may generally be a storage medium, may contain one or more data repositories for storing data that is received and/or generated. The data storage component 406 may be any physical storage medium, including, but not limited to, a hard disk drive (HDD), memory, removable storage, and/or the like. While the data storage component 406 is depicted as a local device, it should be understood that the data storage component 406 may be a remote storage device, such as, for example, a server computing device, cloud based storage device, or the like. Illustrative data that may be contained within the data storage component 406 includes, but is not limited to, emission data 422, computed data 424, and/or other data 426. Referring also to FIG. 1A, the emission data 422 may generally be data that is generated and/or received as a result of a measurement of the electron beams 151, 152 as they impinge on a surface. The emission data 422 may be generated by, for example, the imaging device 108. In some embodiments, the emission data 422 may be transmitted by the imaging device 108.

Referring again to FIG. 3A, the computed data 424 may be data that is generated as a result of fitting the shape according to the data corresponding to the electrical response and/or data corresponding to the x-ray response to a mathematical expression, determining a beam spot size, and/or determining whether an interaction occurs upon movement of the EB guns 101, 102 (FIG. 1A), as described in greater detail herein. Still referring to FIG. 3A, the other data 426 may generally be any other data that is usable for the purposes of calibrating the EB guns 101, 102 (FIGS. 1A-1B), determining a melt strategy, executing the melt strategy, and/or the like, as described herein.

It should be understood that the components illustrated in FIG. 3A are merely illustrative and are not intended to limit the scope of this disclosure. More specifically, while the components in FIG. 3A are illustrated as residing within the analysis component 140, this is a nonlimiting example. In some embodiments, one or more of the components may reside external to the analysis component 140.

Figure 4:
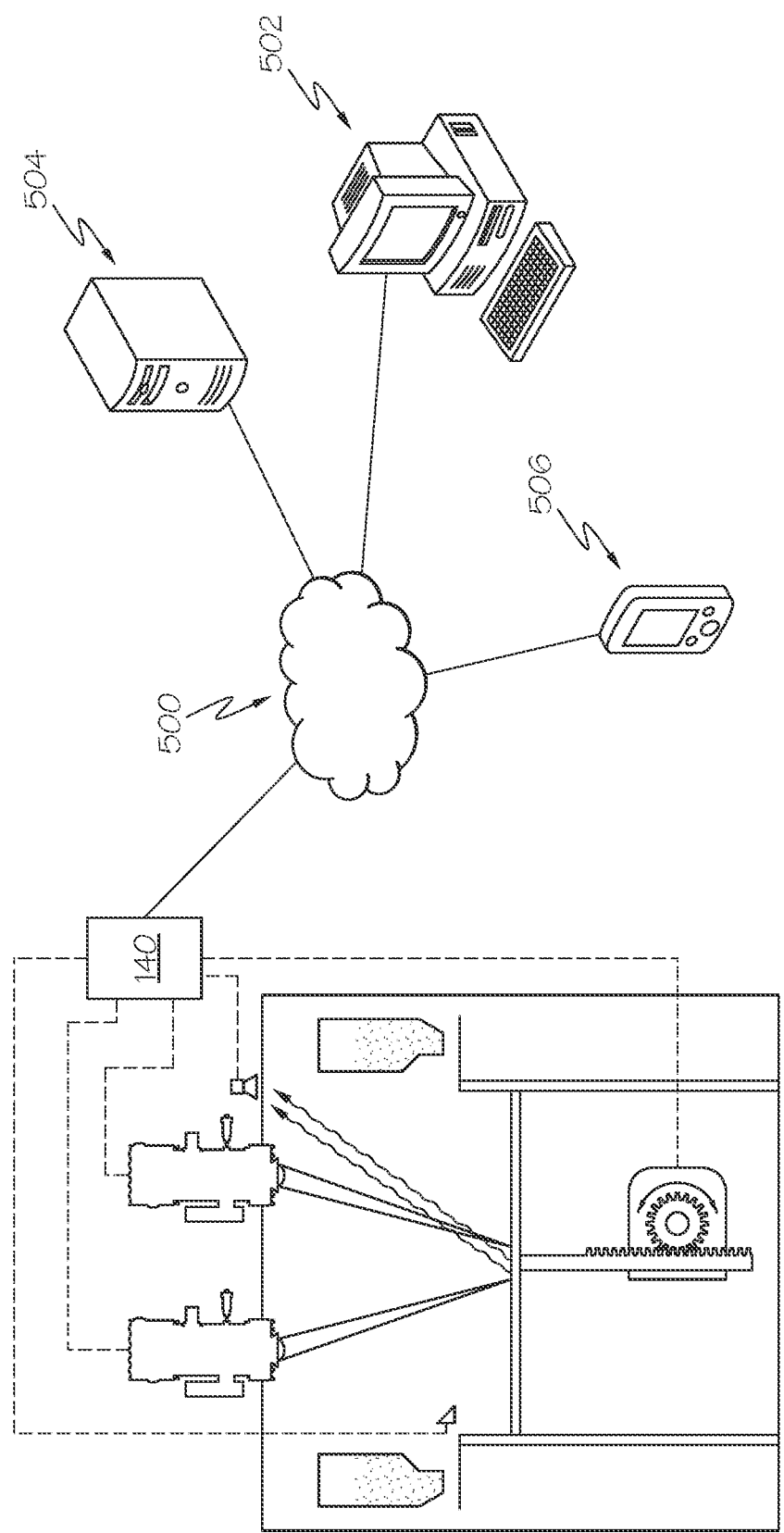
FIG. 4 depicts an illustrative control network according to one or more embodiments shown and described herein.

Referring now to FIG. 4, an illustrative control network 500 is depicted. As illustrated in FIG. 4, the control network 500 may include a wide area network (WAN), such as the Internet, a local area network (LAN), a mobile communications network, a public service telephone network (PSTN), a personal area network (PAN), a metropolitan area network (MAN), a virtual private network (VPN), and/or another network. The control network 500 may generally be configured to electronically connect one or more systems and/or devices, such as, for example, computing devices, servers, electronic devices, additive manufacturing systems, and/or components of any of the foregoing. Illustrative systems and/or devices may include, but are not limited to, a user computing device 502, a database server 504, an electronic device 506, and/or the analysis component 140 of the additive manufacturing system 100 of FIGS. 1A-1B.

Still referring to FIG. 4, the user computing device 502 may generally be used as an interface between a user and the other components connected to the control network 500. Thus, the user computing device 502 may be used to perform one or more user-facing functions, such as receiving one or more inputs from a user or providing information to the user. Accordingly, the user computing device 502 may include at least a display and/or input hardware. In the event that any of the other devices connected to the control network 500 (e.g., the database server 504, the electronic device 506, and/or the analysis component 140), requires oversight, updating, and/or correction, the user computing device 502 may be configured to provide the desired oversight, updating, and/or correction. The user computing device 502 may also be used to input data that is usable to determine a type of material being used for additive manufacture, a number of EB guns to utilize, a desired strategy for forming an article using the additive manufacturing system 100 (e.g., EB gun movement strategy), and/or the like. That is, a user may input information via the user computing device 502 to control various parameters of the additive manufacturing process.

The database server 504 is generally a repository of data that is used for the purposes of calibrating the EB guns and/or employing a particular melt strategy as described herein. That is, the database server 504 may contain one or more storage devices for storing data pertaining to information received from the imaging device 108 (FIG. 1A), any generated calculations, and/or the like. In some embodiments, the database server 504 may contain information therein that mirrors the information stored in the data storage component 406 (FIG. 3A) or may be used as an alternative to the data storage component 406 (FIG. 3A), such as an offsite data repository. The database server 504 may be accessible by one or more other devices and/or systems coupled to the control network 500 and may provide the data as needed.

The electronic device 506 may generally be any device that contains hardware that is operable to be used as an interface between a user and the other components of the control network 500. Thus, the electronic device 506 may be used to perform one or more user-facing functions, such as, for example, receiving data one or more external components, displaying information to a user, receiving one or more user inputs, transmitting signals corresponding to the one or more user inputs, and/or the like. While FIG. 4 depicts the electronic device 506 as a smart phone, it should be understood that this is a nonlimiting example. That is, the electronic device 506 may be any mobile phone, a tablet computing device, a personal computing device (e.g., a personal computer), and/or the like.

It should be understood that while the user computing device 502 is depicted as a personal computer, the database server 504 is depicted as a server, and the electronic device 506 is depicted as a mobile device, these are nonlimiting examples. In some embodiments, any type of computing device (e.g., mobile computing device, personal computer, server, cloud-based network of devices, etc.) or specialized electronic device may be used for any of these components. Additionally, while each of these computing devices is illustrated in FIG. 4 as a single piece of hardware, this is also merely an example. Each of the user computing device 502, the database server 504, and the electronic device 506 may represent a plurality of computers, servers, databases, components, and/or the like.

While FIG. 4 depicts the various systems and/or components communicatively coupled to one another via the control network 500, this is merely illustrative. In some embodiments, various components may be communicatively coupled to one another via a direct connection. In some embodiments, various components may be integrated into a single device.

The various embodiments depicted in FIGS. 1A-1B, 2A-2B, 3A-3B, and 4 should now generally be understood. That is, the embodiments depicted in FIG. 1A-1B includes the build chamber 120 with a plurality of EB guns (e.g., the first EB gun 101 and the second EB gun 102). As depicted in the embodiments of FIGS. 2A and 2B, each of the plurality of EB guns includes an electron emitter and a plurality of coils, each of which are adjustable to cause the electron beam emitted by each EB gun to exhibit certain characteristics. In the embodiment depicted in FIGS. 3A-3B, the analysis component 140 may include various internal components that provide functionality for the analysis component 140 to determine characteristics of the electron beams emitted from each of the plurality of EB guns, determine a calibration of each of the plurality of EB guns that avoids or minimizes interaction between electron beams, and directs adjustment of the coils in each of the plurality of EB guns. Further, external control of the various components of FIGS. 1A-1B, 2A-2B, and 3A-3B can be completed using one or more of the components depicted in the embodiment of FIG. 4.

In operation, during a calibration cycle, the imaging device 108 is actuated and the build platform 114 is adjusted (e.g., raised or lowered) such that a top surface of the build platform 114 is generally aligned with the powder distributor 110. That is, a top surface of the build platform 114 is generally at a height corresponding to where the powder layer being fused would be if the powder layer was on the build platform 114 to ensure an accurate calibration. The EB guns 101, 102 may be aimed and activated to emit the electron beams 151, 152. Data is measured from the impingement of the electron beams 151, 152 on the build platform 114 and is processed for the purposes of calibrating the EB guns, as described in greater detail herein.

During a work cycle (e.g., after the EB guns 101, 102 have been calibrated according to the calibration cycle), the build platform 114 may be lowered successively in relation to the EB guns 101, 102 (e.g., in the -y direction of the coordinate axes depicted in FIG. 1B) after each added powder layer 118 is placed. This means that the build platform 114 starts in an initial position, in which a first powder layer 118 of a particular thickness is laid down on the build platform. In some embodiments, the first powder layer 118 may be thicker than the other applied layers, so as to avoid a melt-through of the first layer onto the build platform 114. The build platform 114 is thereafter lowered in connection with laying down a second powder layer 118 for the formation of a new cross section of the article 116. In an example embodiment, the article 116 may be formed through successive fusion of layers the raw material supplied from the raw material hoppers 106, 107 on the build platform 114 (e.g., successive fusion of layers of powder layer 118). Each layer corresponds to successive cross sections of the article 116. Such a fusion may be particularly completed based on instructions generated from a model the article 116. In some embodiments, the model may be generated via a CAD (Computer Aided Design) tool.

In embodiments, the plurality of EB guns 101, 102 each generate a respective electron beam 151, 152 that, when contacting the raw material located on the build platform 114, melts or fuses together the raw material to form a first layer of the powder layer 118 on the build platform 114. In some embodiments, the analysis component 140 may be used for calibrating, controlling, and managing the each of the electron beams 151, 152 emitted from the respective EB guns 101, 102 by transmitting one or more signals and/or data to the EB guns 101 to adjust the coils 204, 206, 208 and 254, 256, 258 thereof, adjust the electron emitters 202, 252 thereof, and/or the like. In an illustrative embodiment, the EB guns 101, 102 each generate a focusable electron beam with an accelerating voltage of about 60 kilovolts (kV) and with a beam power in the range of about 0 kilowatts (kW) to about 3 kW. A pressure in the interior 104 of the build chamber 120 may be in the range of about $10^{-3}$ millibars (mBar) to about $10^{-6}$ mBar when constructing the article 116 by fusing each successive powder layer 118 with the electron beams 151, 152. In some embodiments, the imaging device 108 may continue to capture images of the beams 151, 152 emitted from the EB guns 101, 102 for the purposes of ensuring continued calibration throughout the build process.

In embodiments, a particular amount of raw material may be provided on the build platform 114. The particular amount of raw material is provided on the build platform 114 from one or more of the raw material hoppers 106, 107, in which the raw material is ejected through the respective outlets on the raw material hoppers 106, 107, thereby creating a screen of raw material on the build platform 114. It should be understood that the use and arrangement of the raw material hoppers 106, 107 to supply the raw material used for forming the powder layer 118 described herein is merely illustrative. That is, other arrangements of supplying and providing raw material, such as a powder container with a moving floor located outside the build chamber 120 or the like is also contemplated and included within the scope of the present disclosure.

In embodiments, a layer from the raw material may be provided on build platform 114. The layer from the raw material may then be collected by the powder distributor 110 by moving the powder distributor 110 a particular distance in a first direction (e.g., in a direction along the plane formed by the x-axis and the y-axis of the coordinate axes depicted in FIG. 1B) into the scree of the raw material, thereby allowing a particular amount of the raw material to fall over a top of the powder distributor 110. The powder distributor 110 is then moved in a second direction (e.g., in another direction along the plane formed by the x-axis and the y-axis of the coordinate axes depicted in FIG. 1B). In some embodiments, the second direction may be opposite to the first direction. Movement of the powder distributor 110 in the second direction may remove the particular amount of the raw material, which has fallen over the top of the powder distributor 110, from the scree of the raw material.

The particular amount of the raw material removed from the scree of the raw material (or provided by any other suitable mechanism) in front of the powder distributor 110 (e.g., adjacent to a leading end of the powder distributor 110) may be moved over the build envelope 112 and/or the build platform 114 by means of the powder distributor 110, thereby distributing the particular amount of the raw material over the build platform 114.

The electron beams 151, 152 emitted from the EB guns 101, 102 may be directed over the build platform 114, thereby causing the powder layer 118 to fuse in particular locations to form a first cross section of the article 116 according to the model generated via the CAD tool. The movement of the electron beams 151, 152 is controlled by the EB guns 101 (including the components thereof, as described herein) such that the electron beams 151, 152 are directed over the build platform 114 based on instructions provided by the analysis component 140 or another device. As described herein, the electron beams 151, 152 are calibrated with respect to one another to avoid or minimize interaction between the electron beams 151, 152. Further, as described herein, the electron beams 151, 152 are adjusted for a high precision mode or a low precision mode depending on the area of the article 116 being formed and the location and movement of each of the electron beams 151, 152 with respect to one another.

After a first powder layer 118 is finished (e.g., after the fusion of raw material for making a first layer of the article 116), a second powder layer 118 is provided on the first powder layer 118. The second powder layer 118 may be distributed according to the same manner as the previous layer, as described herein. However, in some embodiments, there might be alternative methods in the same additive manufacturing machine for distributing the raw material. For instance, a first layer may be provided by means of a first powder distributor and a second layer may be provided by a second powder distributor.

After the second powder layer 118 is distributed on the first powder layer 118, the calibrated electron beams 151, 152 are directed over the build platform 114, causing the second powder layer 118 to fuse in selected locations to form a second cross section of the article 116. Fused portions in the second layer may be bonded to fused portions of said first layer. The fused portions in the first and second layer may be melted together by melting not only the material in the uppermost layer but also remelting at least a portion of a thickness of a layer directly below the uppermost layer.

Figure 5:
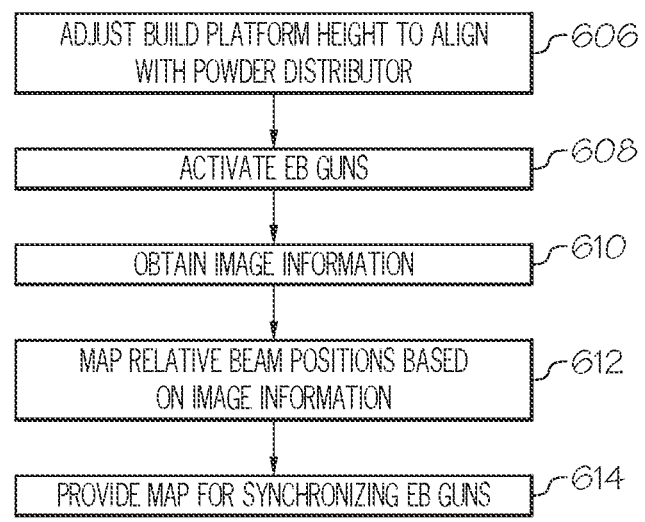
FIG. 5 depicts a flow diagram of an illustrative overview method of calibrating a plurality of electron beam emitters in an additive manufacturing system according to one or more embodiments shown and described herein.

FIG. 5 schematically depicts a block diagram of an illustrative overview method of calibrating the EB guns depicted in FIG. 1A. Referring to FIGS. 1A and 5, the build platform 114 is adjusted at block 606 to align with the power distributor in order to ensure that the imaging device 108 accurately measures the beams 151, 152 emitted by the EB guns 101, 102. The build platform 114 can be adjusted to align the build platform 114 with the powder distributor such that the build platform 114 is about the same height of the powder layer 118 (FIG. 1B) during a EBM process, as described herein. That is, the build platform 114 is adjusted at block 606 such that distance between the build platform 114 and the EB guns 101, 102 is about the same distance as would be expected between the powder layer 118 (FIG. 1B) and the EB guns 101, 102 during an EBM process.

At block 608, the EB guns 101, 102 are activated such that the electron beams 151, 152 impinge on the build platform 114, which is captured as image data by the imaging device 108. In some embodiments, the x-ray radiation resulting from impingement may also be detected by the imaging device 108. The image information from the imaging device 108 is obtained at block 610 (e.g., obtained by the analysis component 140) and is used to map the relative beam positions at block 612. The map that is generated is then provided at block 614 for synchronizing the EB guns 101, 102 (e.g., synchronizing the coils thereof) to avoid or minimize interaction between the EB guns 101, 102 or components thereof.

Figure 6:
FIG. 6 depicts a flow diagram of an illustrative method of calibrating a plurality of electron beam emitters according to one or more embodiments shown and described herein.

FIG. 6 schematically depicts a block diagram of an illustrative method of calibrating the EB guns 101, 102 in the embodiment depicted in FIG. 1A for use concurrently to form the article 116. While FIG. 6 relates to the calibration of two EB guns, it should be understood that the processes described with respect to FIG. 6 may be completed for any number of EB guns, including 3 EB guns, 4 EB guns, 5 EB guns, 6 EB guns, or greater than 6 EB guns. In addition, the processes described with respect to FIG. 6 generally relate to processes carried out by the analysis component 140 (FIG. 1A). However, it should be understood that other components may be used in addition to, in lieu of, or in conjunction with the analysis component 140 in each of the processes described in FIG. 6 without departing from the scope of the present disclosure.

Referring to FIGS. 1A and 6, the analysis component 140 may direct actuation of the imaging device 108 at block 702. Directing actuation may include, for example, providing an actuation signal or the like to the imaging device 108, directing power to be supplied to the imaging device 108, and/or the like. In some embodiments, the imaging device 108 may be actuated and ready to sense without receiving an actuation signal or the like from the analysis component 140. In such embodiments, the process according to block 702 may be omitted.

At block 704, the analysis component 140 directs the first EB gun 101 to actuate. That is, referring also to FIG. 2A, the analysis component 140 transmits a signal to the power supply 210 and/or the gun control unit 212 to actuate the electron emitter 202, the at least one astigmatism coil 204, the at least one focusing coil 206, and/or the at least one deflection coil 208. Actuation of the components of the first EB gun 101 cause the electron beam 151 to be emitted from the EB gun 101.

Figure 7A:
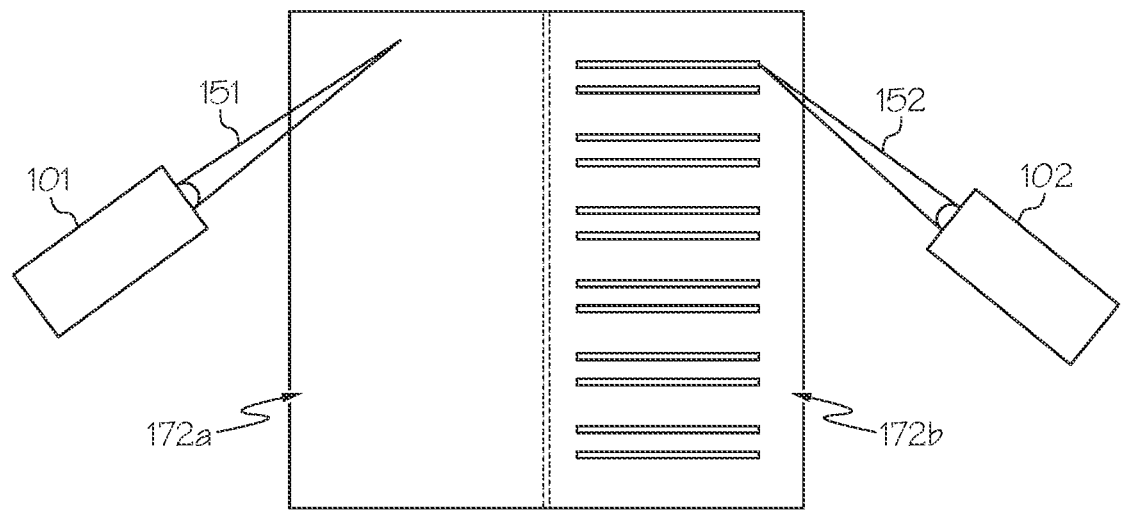
FIG. 7A schematically depicts movement of a first electron beam emitter relative to a second electron beam emitter during a calibration process according to one or more embodiments shown and described herein.

In addition to directing actuation, the analysis component 140 may also direct the EB gun 101 to move the electron beam 151 to a calibrated position on the build platform 114 at block 706. That is, the analysis component 140 may provide one or more signals to the power supply 210 and/or the gun control unit 212 to adjust the electrical power supplied to one or more of the coils (e.g., the at least one astigmatism coil 204, the at least one focusing coil 206, and/or the at least one deflection coil 208) such that the electron beam 151 is aimed at a particular location on the build platform 114. For example, as shown in FIG. 7A, the first EB gun 101 emits the beam 151 towards a first portion 172a of a build surface (e.g., the build platform 114, a start plate, a an article that is being formed, or the like) as a result of the signals received from the analysis component 140. More specifically, the first EB gun 101 emits the beam 151 to one or more particular locations on the first portion 172a of the build surface. In some embodiments, the beam 151 may be emitted such that it impinges on a static location. In other embodiments, the beam 151 may be emitted such that it moves according to a predetermined pattern (e.g., executes a scan function) over the build surface such that it sweeps across the build surface. The build surface may be illuminated and used for the purposes of calibrating the imaging device 108 (FIGS. 1A-1B), which is then used for subsequent calibration of the EB guns 101, 102. In embodiments where the imaging device 108 is an x-ray pin-hole camera, the imaging device 108 is calibrated with a calibration probe that includes an array of conducting thin threads of a metal that cause generation of an electrical signal corresponding to impingement of electron beams thereon, which are detected by an oscilloscope and used for the purposes of calibrating the imaging device 108. In embodiments where the imaging device 108 is an RGB camera or the like, the build surface may be illuminated using an external light source, and use of the electron beams is not needed. The calibration would return one or more value in pixelwise format (e.g., coordinates or other identification of pixels of a captured image). For instance, an image of a thermal response may be captured by the imaging device 108. Thus, one can be sure that different machines have the same spot size even if the spot size is not known in absolute mm. Such a calibration may depend on the resolution of the imaging device 108.

In some embodiments, the build surface may be the build platform, an article being formed, a start plate, or some other removable plate that is placed over the build area prior to a calibration process, and then removed prior to article formation. In embodiments where the imaging device 108 is an RGB camera or the like, the imaging device 108 may be calibrated with regard to both position and light intensity over the build surface. In embodiments where the imaging device 108 is an x-ray unit (e.g., a pin-hole camera or the like), the imaging device 108 may be calibrated using a calibration probe that is used to measure electrical signals and corresponding x-rays emitted as a result of impingement, as described, for example, in copending U.S. application Ser. No. 17/349,997, which is hereby incorporated by reference. It should be understood that the imaging device 108 has an added benefit of being usable not only during an initial calibration process, but throughout an entire build process such that adjustments can be made during a build process, if necessary.

Referring again to FIGS. 1A, 2B and 6, at block 708, the analysis component 140 directs the second EB gun 102 to actuate. That is, referring also to FIG. 2B, the analysis component 140 transmits a signal to the power supply 260 and/or the gun control unit 262 to actuate the electron emitter 252, the at least one astigmatism coil 254, the at least one focusing coil 256, and/or the at least one deflection coil 258. Actuation of the components of the second EB gun 102 cause the electron beam 152 to be emitted from the second EB gun 102. In addition to directing actuation, the analysis component 140 may also provide predefined coil values to the second EB gun 102 to cause the second EB gun 102 to move the electron beam 152 in a predetermined pattern according to the predefined coil values on the surface within the build chamber 120 (e.g., the build platform 114) at block 710. That is, the analysis component 140 may provide one or more signals to the power supply 260 and/or the gun control unit 262 over a period of time to adjust the electrical power supplied to one or more of the coils (e.g., the at least one astigmatism coil 254, the at least one focusing coil 256, and/or the at least one deflection coil 258) such that the electron beam 152 moves according to a particular pattern on the build surface (e.g., the build platform 114 or the article 116 thereon). For example, as shown in FIG. 7A, the second EB gun 102 emits the beam 152 towards a second portion 172b of the build surface as a result of the signals received from the analysis component 140 and continues to move the beam 152 along a pattern, as indicated by the lines located on the second portion 172b. In some embodiments, the pattern may be located such that the beam 152 does not cross over on the second portion 172b when moving according to the pattern. In other embodiments, the pattern may be located such that the beam 152 does cross over onto the second portion 172b when moving according to the pattern.

Referring again to FIGS. 1A, 6, and 7A, the analysis component 140 receives image data (e.g., x-ray data and/or visual image data) from the imaging device 108 that corresponds to the impingement of the first beam 151 on the first portion 172a of the build surface at block 712. In some embodiments, the image data generally includes a succession of images captured as a result of impingement of the first beam 151 on the first portion 172a of the build surface over a measured period of time.

At block 716, a map is generated from the received image data at block 716. That is, the analysis component 140 generates a map that indicates one or more locations where interaction occurs between the first EB gun 101 and the second EB gun 102. Generation of the map generally includes determining a shape of the first electron beam 151 based on the image data and determining a corresponding location of the second electron beam 152 (and thus the coil values corresponding thereto) at each determined shape of the first electron beam 151. Thus, when the shape of the first electron beam becomes distorted, the image data at the same point of time are observed to determine an intensity of the emissions, which can be used to determine whether interaction is occurring. Image data from the same location is compared when the other beam is off or on to determine whether interaction exists. Determining the shape of the first electron beam 151 with a calibrated imaging device generally includes assuming the that the observed spot is Gaussian shaped and using a mathematical procedure to interpret the image data as an intensity generated by a Gaussian energy source with a certain distribution. The resolution of the image data will determine how well the Gaussian distribution can be estimated.

Figure 7B:
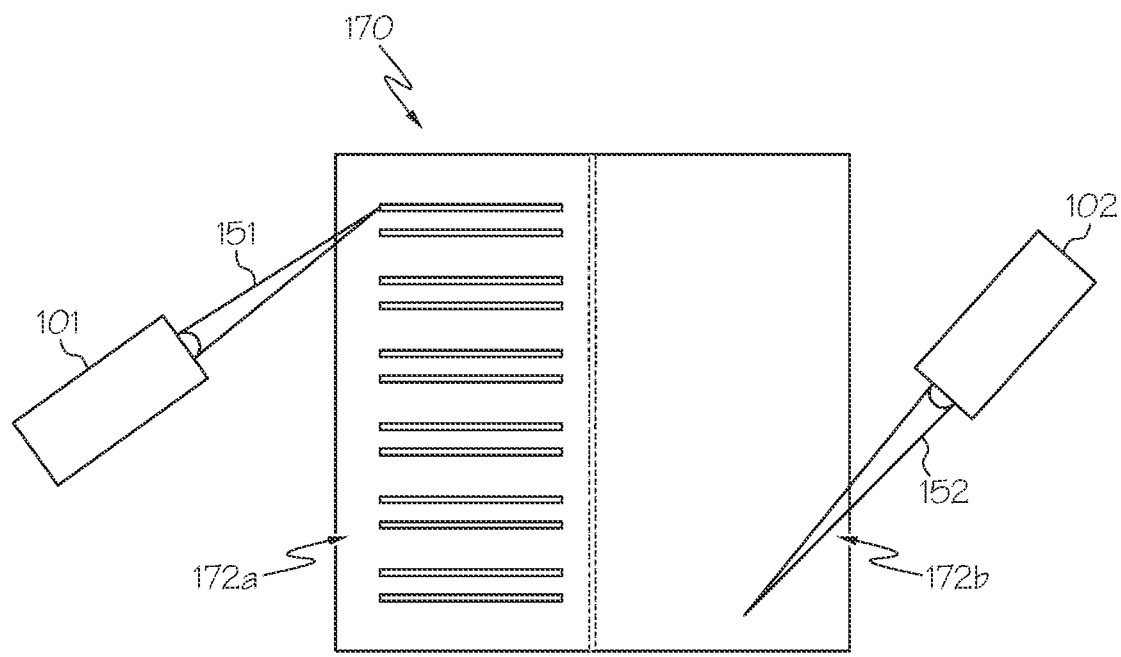
FIG. 7B schematically depicts movement of a second electron beam emitter relative to a first electron beam emitter during a calibration process according to one or more embodiments shown and described herein.

Referring to FIGS. 1A, 2B, and 6, at block 718, the analysis component 140 may also direct the second EB gun 102 to move the electron beam 152 to a calibrated position on the build platform 114. That is, the analysis component 140 may provide one or more signals to the power supply 260 and/or the gun control unit 262 to adjust the electrical power supplied to one or more of the coils (e.g., the at least one astigmatism coil 254, the at least one focusing coil 256, and/or the at least one deflection coil 258) such that the electron beam 152 is aimed at a particular location on the build platform 114. For example, as shown in FIG. 7B, the second EB gun 102 emits the beam 152 towards the second portion 172b of the build surface as a result of the signals received from the analysis component 140. More specifically, the second EB gun 102 emits the beam 152 to one or more particular locations on the second portion 172b of the build surface or at another location on the build surface.

Referring again to FIGS. 1A, 2A, and 6, at block 720, the analysis component 140 provides predefined coil values to the first EB gun 101 to cause the first EB gun 101 to move the electron beam 151 in a predetermined pattern according to the predefined coil values on the build platform 114. That is, the analysis component 140 may provide one or more signals to the power supply 210 and/or the gun control unit 212 over a period of time to adjust the electrical power supplied to one or more of the coils (e.g., the at least one astigmatism coil 204, the at least one focusing coil 206, and/or the at least one deflection coil 208) such that the electron beam 151 moves according to a particular pattern on the build platform. For example, as shown in FIG. 8B, the first EB gun 101 emits the beam 151 towards a first portion 172a of the build surface as a result of the signals received from the analysis component 140 and continues to move the beam 151 along a pattern, as indicated by the lines located on the first portion 172a. In some embodiments, the pattern may be located such that the beam 151 does not impinge on the second portion 172b when moving according to the pattern. In other embodiments, the pattern may be located such that the beam 151 does cross over 9 on the second portion 172b when moving according to the pattern.

Referring again to FIGS. 1A, 6, and 7B, the analysis component 140 receives image data from the imaging device 108 that corresponds to the impingement of the second beam 152 on the second portion 172b of the build surface at block 722. In some embodiments, the image data includes a series of images captured of the impingement of the second beam 152 on the second portion 172b of the build surface over a measured period of time.

At block 726, the map is updated to correspond to the received image data. That is, the analysis component 140 updates the map to indicates one or more locations where interaction occurs between the first EB gun 101 and the second EB gun 102 for the purposes of calibrating the second EB gun 102 in addition to the first EB gun 101. Updating the map generally includes determining a shape of the second electron beam 152 based on the image data and determining a corresponding location of the first electron beam 151 (and thus the coil values corresponding thereto) at each determined shape of the second electron beam 152. Thus, when the shape of the first electron beam becomes distorted, the image data at the same point of time are observed to determine an intensity of the emissions, which can be used to determine whether interaction is occurring. Determining the shape of the first electron beam 151 with a calibrated imaging device generally includes assuming the that the observed spot is Gaussian shaped and using a mathematical procedure to interpret the image data as an intensity generated by a Gaussian energy source with a certain distribution. The resolution of the image data will determine how well the Gaussian distribution can be estimated.

The calibration approach can be mathematically expressed according to Equation (1) below:

$$\text{Coli}\_i\_j = F(x, y, \text{"spot size"}) \tag{1}$$

where, for each x and y position, and "spot size" F(x,y beam current, spot size), there is a set of coil signals. i refers to a specific EB gun and j refers to a specific coil on the specific EB gun. This procedure is repeated for each gun of the plurality of EB guns 101, 102. Accordingly, calibration of all of the EB guns is expressed according to Equation (2):

$$\text{Coli}\_i\_j = F(x, y, \text{"spot size"}) + \text{Sum}\_k \, \text{Sum}\_j \, F(\text{coil}\_k\_j) \tag{2}$$

F(coil_k_j) may be functions of coil signal and its derivatives. (k is the index for the gun). A mean field strategy is then employed by solving a set of Equation (2) for one gun. This results in coil_j_i. Then coil_j_i is put back to the next set of equation for gun k and so forth. The process is repeated iteratively until the signals are stabilized.

At block 728, the map and calibration calculations are provided to an external component and are used for calibrating the EB guns 101, 102. For example, the map may be provided to the database server 504 (FIG. 4) for storage and/or future retrieval. In some embodiments, the map and associated data therewith may be provided in a user-readable format. That is, a display may be directed to display the map and/or associated data in a user interface. The user interface may be displayed, for example, to a user of the user computing device 502 (FIG. 4).

While FIG. 6 relates only to the calibration of two EB guns, it should be understood that the processes described in FIG. 6 can be repeated for each additional EB gun in embodiments where greater than two EB guns are included. Accordingly, the map is updated to account for each additional EB gun.

Figure 8:
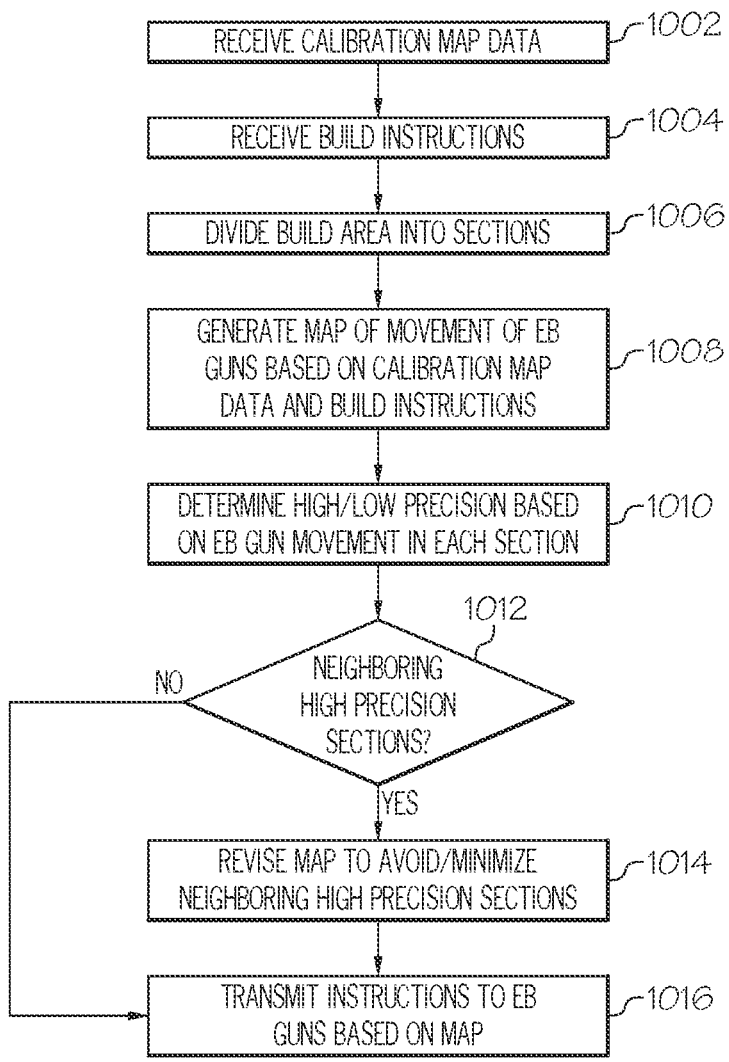
FIG. 8 depicts a flow diagram of an illustrative method of controlling a sequence of movement and/or precision of each of a plurality of electron beam emitters in an additive manufacturing system according to one or more embodiments shown and described herein.

Once the EB guns 101, 102 have been calibrated, they can be used for forming an object as described herein. In some embodiments, it may not be possible to resolve all of the interaction issues between the EB guns 101, 102. For example, even after calibration, use of a plurality of EB guns can result in interaction that cannot be overcome fully with calibration. That is, the calibration process described herein may remove some interaction, but may not be able to remove all interaction (e.g., interaction when the EB guns 101, 102 are particularly aimed with respect to one another, or interaction that cannot be accounted for in a fully correlated manner). In such embodiments, it may be advantageous to employ a melt strategy whereby one or more EB guns are operated in a low precision mode while another one or more EB guns are operated in a high precision. The EB guns running in low precision mode could be used for heating the build surface 118 without melting, since it is necessary to maintain a high build temperature during EBM processes. FIG. 8 depicts a flow diagram of an illustrative method that may be employed to implement a melt strategy that addresses these issues.

Referring to FIGS. 1B, 4, and 8, at block 1002, the calibrated map data is received. That is, the data that is used for the purposes of calibrating the EB guns 101, 102 is retrieved from storage, such as, for example, from the database server 504. In addition to the calibrated map data, build instructions are also received at block 1004. The build instructions are generally data that is used for directing movement and/or operation of the components of the additive manufacturing system 100 to build the article 116, and may be stored in the database server 504, may be inputted by a user via the user computing device 502 and/or the electronic device 506, and/or the like.

Figure 9:
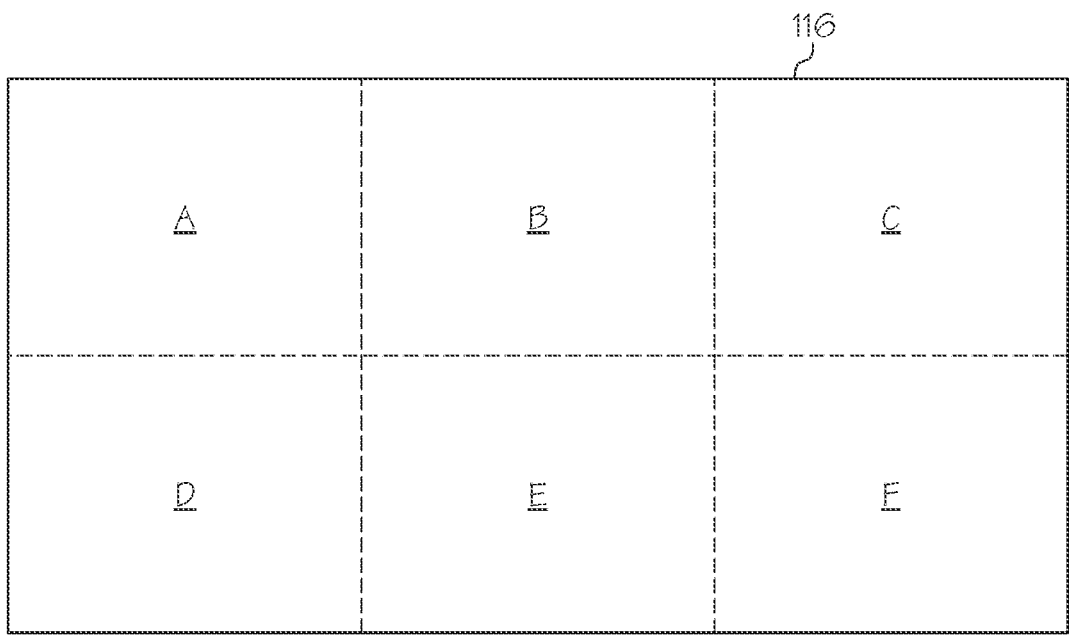
FIG. 9 schematically depicts a workpiece area divided into sections for the purposes of controlling a sequence of movement and/or precision of each of a plurality of electron beam emitters according to one or more embodiments shown and described herein.

At block 1006, the build area (e.g., the build envelope 112) may be divided into a plurality of sections, each section representing an area of the build area where, if a high precision mode is operated with one EB gun, it would be necessary to avoid using a high precision mode in adjacent areas. FIG. 9 depicts the build area (e.g., the area containing the article 116) divided into sections A, B, C, D, E, and F. While sections A, B, C, D, E, and F are depicted in FIG. 9 as being generally equal in shape and size and are in a grid configuration, the present disclosure is not limited to such. That is, the sections may be any shape, size, configuration, and/or arrangement, irrespective of the shape, size, configuration, and/or arrangement of other sections.

Referring to FIGS. 1B and 8, at block 1008, a map of planned movement of the EB guns 101, 102 may be generated based on the calibration map data and the build instructions. That is, a plan of the respective movement of the first EB gun 101 and the second EB gun 102 may be generated based on a calibration of the first EB gun 101, the second EB gun 102, movements and/or respective locations that are known to cause interaction, locations where melting is necessary for each build layer, locations where high precision melting is needed, locations where low precision melting is acceptable, and/or the like. Based on the map, a determination may be made as to where high precision and low precision melting is needed for each of the sections at block 1010. If high precision melting is needed at a particular section at a particular point in time, it may be necessary to ensure that only low precision melting occurs in the surrounding sections at the same time. For example, referring to the example depicted in FIG. 9, if high precision is needed in sections A and C at a particular point in time, then any melting that occurs in sections B, D, E, and F should avoid high precision melting and only use low precision melting to avoid interaction. Other examples are presented in Table 1 below:

| High Precision Sections | Low Precision Sections |
| --- | --- |
| A, C | B, D, E, F |
| D, F | A, B, C, E |
| B | A, C, D, E, F |
| E | A, B, C, D, F |

At block 1012, a determination is made as to whether neighboring high precision sections exist at a particular point in time (e.g., both sections B and C require high precision at a particular period of time). If no neighboring high precision sections exist, the process proceeds to block 1016. If neighboring high precision sections do exist, the process proceeds to block 1014.

At block 1014, the map may be revised to avoid or minimize the amount of neighboring high precision sections at a particular period in time. For example, the movement path of the EB guns 101, 102 may be revised to avoid or minimize an amount of neighboring high precision sections at one or more particular periods. At block 1016, instructions based on the map may be transmitted to the EB guns 101, 102 to cause the EB guns 101, 102 to build the article 116 based on the instructions.

It should now be understood that that the devices, systems, and methods described herein allow for use of a plurality of EB guns to form metallic articles in EBM. Using the imaging device in conjunction with the various other components described herein, each one of the plurality of EB guns are particularly calibrated to avoid or minimize instances where the magnetic fields of the coils in each of the respective EB guns interact with one another. This interaction can further be avoided or minimized by coordinating the movement of the EB guns (controlling a sequence of movement and/or precision (e.g., low precision mode, high precision mode)).

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

Further aspects of the invention are provided by the subject matter of the following clauses:

1. A calibration system for an electron beam additive manufacturing system comprising a plurality of electron beam guns, the calibration system comprising: an imaging device positioned to capture one or more images of an impingement of electron beams emitted from the plurality of electron beam guns on a surface within a build chamber of the electron beam additive manufacturing system; and an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters.

2. The calibration system of any preceding clause, wherein the one or more images comprise one or more x-ray images.

3. The calibration system of any preceding clause, wherein the surface within the build chamber is on a build platform.

4. The calibration system of any preceding clause, wherein the analysis component receives images captured when a first electron beam impinges on a first portion of a build surface while moving according to a particular pattern and a second electron beam impinges on a second portion of the build surface while remaining in a static position.

5. The calibration system of any preceding clause, wherein the analysis component receives additional images captured when the first electron beam impinges on the first portion while remaining in a static position and the second electron beam impinges on the second portion while moving according to another particular pattern.

6. The calibration system of any preceding clause, wherein the imaging device is further positioned at a location outside the build chamber of the electron beam additive manufacturing system, the imaging device aimed through a window in a wall of the build chamber such that a field of view of the imaging device encompasses the surface within the build chamber.

7. An electron beam additive manufacturing system, the electron beam manufacturing system comprising: a build chamber; a plurality of electron beam guns, each one of the plurality of electron beam guns emitting a corresponding electron beam within the build chamber; and a calibration system that calibrates each one of the plurality of electron beam guns, the calibration system comprising: an imaging device positioned to capture one or more images of an impingement of electron beams emitted from the plurality of electron beam guns on a surface within the build chamber, and an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters.

8. The electron beam additive manufacturing system of any preceding clause, wherein the one or more images comprise one or more x-ray images.

9. The electron beam additive manufacturing system of any preceding clause, wherein the build chamber comprises a build envelope having a movable build platform, the movable build platform having the surface upon which the impingement occurs.

10. The electron beam additive manufacturing system of any preceding clause, further comprising a powder distributor communicatively coupled to the analysis component, wherein the build platform is vertically aligned with the powder distributor.

11. The electron beam additive manufacturing system of any preceding clause, wherein the analysis component receives images captured when a first electron beam impinges on a first portion of a build surface while moving according to a particular pattern and a second electron beam impinges on a second portion of the build surface while remaining in a static position.

12. The electron beam additive manufacturing system of any preceding clause, wherein the analysis component receives additional images captured when the first electron beam impinges on the first portion while remaining in a static position and the second electron beam impinges on the second portion while moving according to another particular pattern.

13. The electron beam additive manufacturing system of any preceding clause, wherein each one of the plurality of electron beam guns comprises one or more focusing coils and one or more deflection coils, each of the one or more focusing coils and the one or more deflection coils receiving a modifiable electrical current that adjusts an electromagnetic field within the coil, the electromagnetic field altering one or more properties of the electron beam.

14. The electron beam additive manufacturing system of any preceding clause, wherein each of the electron beam guns further comprises at least one gun control unit that is communicatively coupled to the analysis component and modifies the modifiable electrical current according to one or more calibration signals received from the analysis component.

15. The electron beam additive manufacturing system of any preceding clause, wherein the one or more focusing coils and the one or more deflection coils are unshielded coils.

16. The electron beam additive manufacturing system of any preceding clause, wherein each one of the plurality of electron beam guns comprises at least one astigmatism coil that receives a modifiable electrical current that adjusts an electromagnetic field within the at least one astigmatism coil, the electromagnetic field altering one or more properties of the electron beam.

17. The electron beam additive manufacturing system of any preceding clause, wherein each of the electron beam guns further comprises at least one gun control unit that is communicatively coupled to the analysis component and modifies the modifiable electrical current according to one or more calibration signals received from the analysis component.

18. The electron beam additive manufacturing system of any preceding clause, wherein the at least one astigmatism coil is an unshielded coil.

19. A method of calibrating a plurality of electron beam guns in a build chamber, the method comprising: directing a first electron beam gun of the plurality of electron beam guns to execute a first scan function, the first scan function causing a first electron beam emitted from the first electron beam gun to impinge on a plurality of portions of a first portion of a surface in the build chamber; providing one or more predetermined coil values to a second electron beam gun of the plurality of electron beam guns, the predetermined coil values, when executed, causing the second electron beam gun to emit a second electron beam that impinges along a predetermined path on a second portion of the surface; receiving image data from an imaging device having a field of view that encompasses the surface, the image data indicative of features of the first electron beam upon impingement on the surface; and synchronizing in time the image data with coil values of the first electron beam gun and the predetermined coil values of the second electron beam gun.

20. The method of any preceding clause, wherein the predetermined coil values are constant in time.

What is claimed is:

1. A calibration system for an electron beam additive manufacturing system comprising a plurality of electron beam guns, the calibration system comprising:
    an imaging device positioned to capture one or more images of an impingement of electron beams emitted from the plurality of electron beam guns on a surface within a build chamber of the electron beam additive manufacturing system; and
    an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters, wherein:
        each electron beam gun of the plurality of electron beam guns comprises a plurality of coils,
        the plurality of coils of each electron beam gun comprises a focusing coil, a deflection coil, and an astigmatism coil,
        the one or more instructions comprise an instruction to modify an electrical current that adjusts an electromagnetic field of at least one coil of at least one of the plurality of coils, and
        at least one coil of each plurality of coils lacks shielding positioned around the at least one coil.

2. The calibration system of claim 1, wherein the one or more images comprise one or more x-ray images.

3. The calibration system of claim 1, wherein the surface within the build chamber is on a build platform.

4. The calibration system of claim 1, wherein the imaging device captures at least one of the one or more images when a first electron beam impinges on a first portion of a build surface while moving according to a particular pattern and a second electron beam impinges on a second portion of the build surface while remaining in a static position.

5. The calibration system of claim 4, wherein the the imaging device further captures at least one of the one or more images when the first electron beam impinges on the first portion while remaining in a static position and the second electron beam impinges on the second portion while moving according to another particular pattern.

6. The calibration system of claim 1, wherein the imaging device is further positioned at a location outside the build chamber of the electron beam additive manufacturing system, the imaging device aimed through a window in a wall of the build chamber such that a field of view of the imaging device encompasses the surface within the build chamber.

7. An electron beam additive manufacturing system, the electron beam manufacturing system comprising:
    a build chamber;
    a plurality of electron beam guns, each one of the plurality of electron beam guns emitting a corresponding electron beam within the build chamber and comprising a plurality of coils, wherein:
        each plurality of coils comprises a focusing coil, a deflection coil, and an astigmatism coil, and
        at least one coil of each plurality of coils lacks shielding positioned around the at least one coil; and
    a calibration system that calibrates each one of the plurality of electron beam guns, the calibration system comprising:
        an imaging device positioned to capture one or more images of an impingement of electron beams emitted from the plurality of electron beam guns on a surface within the build chamber, and
        an analysis component communicatively coupled to the imaging device and programmed to receive image data corresponding to the one or more images, determine one or more calibration parameters from the image data, and transmit one or more instructions to the plurality of electron beam guns in accordance with the one or more calibration parameters.

8. The electron beam additive manufacturing system of claim 7, wherein the one or more images comprise one or more x-ray images.

9. The electron beam additive manufacturing system of claim 7, wherein the build chamber comprises a build envelope having a movable build platform, the movable build platform having the surface upon which the impingement occurs.

10. The electron beam additive manufacturing system of claim 9, further comprising a powder distributor communicatively coupled to the analysis component, wherein the build platform is vertically aligned with the powder distributor.

11. The electron beam additive manufacturing system of claim 7, wherein the imaging device captures at least one of the one or more images when a first electron beam impinges on a first portion of a build surface while moving according to a particular pattern and a second electron beam impinges on a second portion of the build surface while remaining in a static position.

12. The electron beam additive manufacturing system of claim 11, wherein the imaging device further captures at least one of the one or more images when the first electron beam impinges on the first portion while remaining in a static position and the second electron beam impinges on the second portion while moving according to another particular pattern.

13. The electron beam additive manufacturing system of claim 7, wherein each of the focusing coil and the deflection coil receives a modifiable electrical current that adjusts an electromagnetic field within the coil, the electromagnetic field altering one or more properties of the electron beam.

14. The electron beam additive manufacturing system of claim 13, wherein each of the electron beam guns further comprises at least one gun control unit that is communicatively coupled to the analysis component and modifies the modifiable electrical current according to one or more calibration signals received from the analysis component.

15. The electron beam additive manufacturing system of claim 13, wherein the focusing coil lacks shielding positioned around the focusing coil and the deflection coil lacks shielding positioned around the deflection coil.

16. The electron beam additive manufacturing system of claim 7, wherein the astigmatism coil receives a modifiable electrical current that adjusts an electromagnetic field within the astigmatism coil, the electromagnetic field altering one or more properties of the electron beam.

17. The electron beam additive manufacturing system of claim 16, wherein each of the electron beam guns further comprises at least one gun control unit that is communicatively coupled to the analysis component and modifies the modifiable electrical current according to one or more calibration signals received from the analysis component.

18. The electron beam additive manufacturing system of claim 16, wherein the astigmatism coil lacks shielding positioned around the astigmatism coil.

* * * * *